(12) United States Patent
Yamakawa et al.

(10) Patent No.: US 10,340,298 B2
(45) Date of Patent: Jul. 2, 2019

(54) SEMICONDUCTOR DEVICE HAVING NEGATIVE FIXED CHARGE, POSITIVE FIXED CHARGE AND ELECTRONIC APPARATUS CAPABLE OF REDUCING A LEAKING CURRENT OF A PN JUNCTION REGION

(71) Applicant: SONY SEMICONDUCTOR SOLUTIONS CORPORATION, Kanagawa (JP)

(72) Inventors: Shinya Yamakawa, Kanagawa (JP); Satoe Miyata, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 10 days.

(21) Appl. No.: 15/320,160

(22) PCT Filed: Jul. 1, 2015

(86) PCT No.: PCT/JP2015/068965
§ 371 (c)(1),
(2) Date: Dec. 19, 2016

(87) PCT Pub. No.: WO2016/009835
PCT Pub. Date: Jan. 21, 2016

(65) Prior Publication Data
US 2017/0141144 A1 May 18, 2017

(30) Foreign Application Priority Data

Jul. 15, 2014 (JP) .................................. 2014-145100

(51) Int. Cl.
*H01L 27/30* (2006.01)
*H01L 27/146* (2006.01)
(Continued)

(52) U.S. Cl.
CPC .... *H01L 27/1461* (2013.01); *H01L 27/14614* (2013.01); *H01L 27/14636* (2013.01);
(Continued)

(58) Field of Classification Search
CPC .............. H04N 5/3745; H01L 27/1461; H01L 27/14614; H01L 27/14636; H01L 27/307; H01L 27/14643; H01L 31/0322
See application file for complete search history.

(56) References Cited

U.S. PATENT DOCUMENTS

2004/0152339 A1* 8/2004 Yokoyama ............. B82Y 10/00
438/778
2004/0251488 A1* 12/2004 Fujiwara ................ G11C 16/26
257/315
(Continued)

FOREIGN PATENT DOCUMENTS

JP 2002-367990 A 12/2002
JP 2005-005513 A 1/2005
(Continued)

OTHER PUBLICATIONS

International Search Report prepared by the Japan Patent Office dated Sep. 7, 2015, for International Application No. PCT/JP2015/068965.

*Primary Examiner* — Luong T Nguyen
(74) *Attorney, Agent, or Firm* — Sheridan Ross P.C.

(57) ABSTRACT

The present disclosure relates to a semiconductor device and an electronic apparatus capable of reducing a leak current of a PN junction region. In a Si substrate, an N+ region is formed in a P-type Well (P_Well region). A depletion layer is formed in the circumference of a boundary (metallurgic boundary of a PN junction) between the P_Well region and the N+ region. On the surface of the Si substrate, a fixed charge layer having positive fixed charge is formed on the N+ region to be spanned to the depletion layer. The present
(Continued)

disclosure is applicable to a CMOS solid-state imaging device used in an imaging apparatus such as a camera.

8 Claims, 24 Drawing Sheets

(51) Int. Cl.
  *H01L 31/032* (2006.01)
  *H04N 5/3745* (2011.01)
(52) U.S. Cl.
  CPC ...... *H01L 27/14643* (2013.01); *H01L 27/307* (2013.01); *H01L 31/0322* (2013.01); *H04N 5/3745* (2013.01); *Y02E 10/541* (2013.01)

(56) References Cited

U.S. PATENT DOCUMENTS

| | | | |
|---|---|---|---|
| 2014/0110806 A1* | 4/2014 | Watanabe | H01L 27/14632 257/432 |
| 2014/0306311 A1* | 10/2014 | Funao | H01L 27/1461 257/432 |

FOREIGN PATENT DOCUMENTS

| | | | |
|---|---|---|---|
| JP | 2007-258684 A | | 10/2007 |
| JP | 2011-146635 A | | 7/2011 |
| JP | 2011-187857 A | | 9/2011 |
| JP | 2011-216623 A | | 10/2011 |
| JP | 2012-169517 A | | 9/2012 |
| JP | 2013-089707 | * | 5/2013 |
| JP | 2013-089707 A | | 5/2013 |
| JP | 2014-120629 A | | 6/2014 |
| WO | WO 2013/111418 A1 | | 8/2013 |
| WO | WO 2014/002365 A1 | | 1/2014 |

* cited by examiner

FIG. 14

| | IFD/IFD STANDARD VALUE | REDUCTION RATIO (%) |
|---|---|---|
| NO LAYER (STANDARD VALUE) | 1.00 | — |
| NEGATIVE CHARGE LAYER ON ENTIRE SURFACE | 0.93 | 7.1 |
| POSITIVE CHARGE LAYER ON N TYPE | 0.69 | 31.4 |
| NEGATIVE CHARGE LAYER ON P TYPE | 0.35 | 65.3 |
| NEGATIVE CHARGE LAYER ON P TYPE + POSITIVE CHARGE LAYER ON N TYPE | 0.22 | 77.5 |

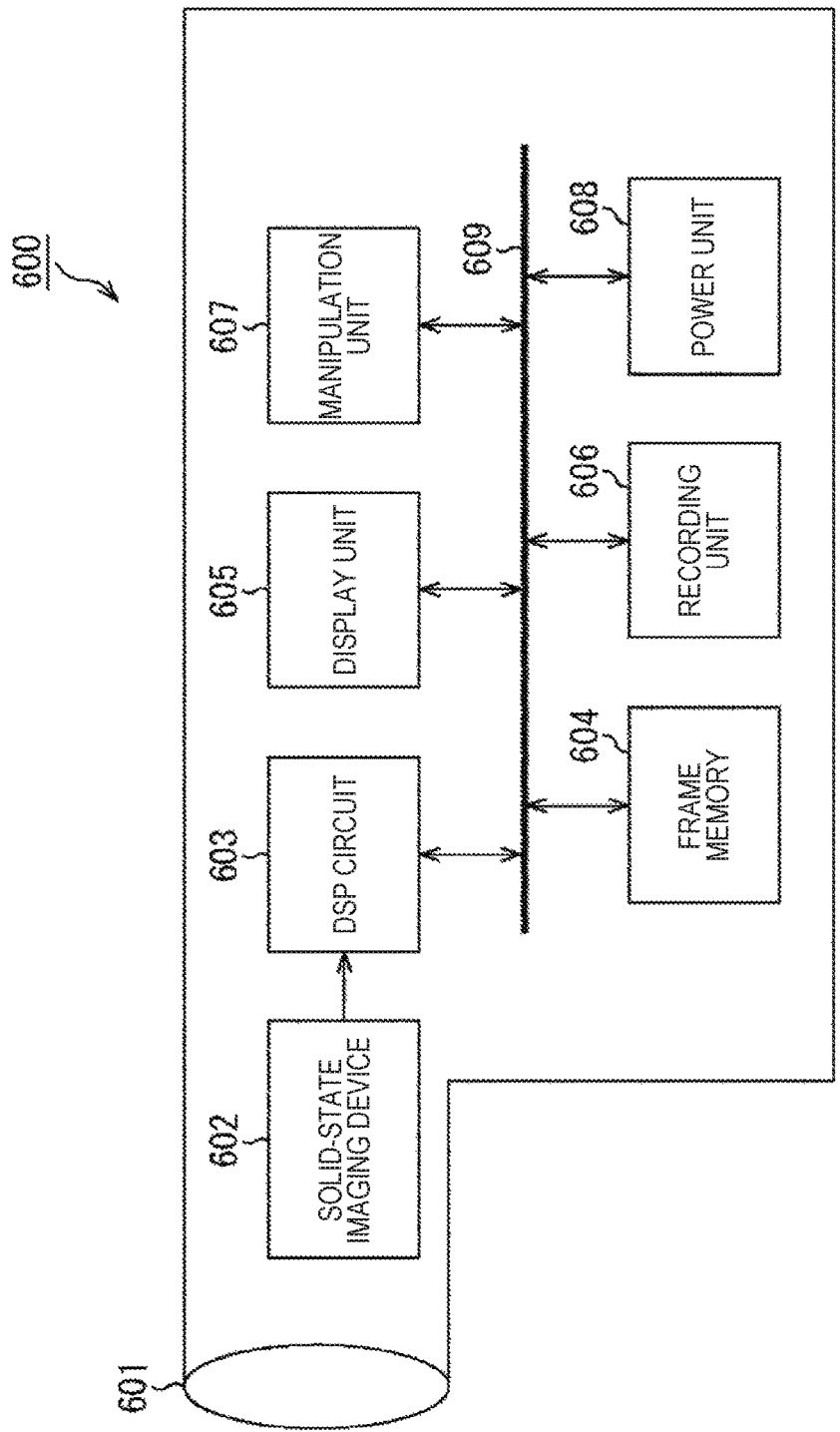

SEMICONDUCTOR DEVICE HAVING NEGATIVE FIXED CHARGE, POSITIVE FIXED CHARGE AND ELECTRONIC APPARATUS CAPABLE OF REDUCING A LEAKING CURRENT OF A PN JUNCTION REGION

CROSS REFERENCE TO RELATED APPLICATIONS

This application is a national stage application under 35 U.S.C. 371 and claims the benefit of PCT Application No PCT/JP2015/068965 having an international filing date of 1 Jul. 2015, which designated the United States, which PCT application claimed the benefit of Japanese Patent Application No. 2014-145100 filed 15 Jul. 2014, the disclosures of which are incorporated herein by reference in their entirety.

TECHNICAL FIELD

The present disclosure relates to a semiconductor device and an electronic apparatus, and particularly, to a semiconductor device and an electronic apparatus capable of reducing a leak current of a PN junction region.

BACKGROUND ART

Solid-state imaging elements (image sensors) using semiconductors are mounted on many apparatuses such as digital cameras, video cameras, monitoring cameras, copy machines, and facsimiles.

In recent years, so-called complementary metal oxide semiconductor (CMOS) solid-state imaging elements manufactured in addition to peripheral circuits in CMOS processes and have been considerably used as solid-state imaging elements. In the CMOS solid-state imaging elements, for example, photodiodes (PDs) converting received light into electric signals and floating diffusions (FDs) temporarily storing charges and sensing signals are formed using PN junctions of semiconductors.

On the other hand, in PN junctions, it is known that leak currents occur particularly when depletion layer regions formed in junction portions come into contact with surfaces or interfaces. In solid-state imaging elements, such leak currents are called dark currents. In order to improve image quality, it is necessary to reduce the leak currents as much as possible. As methods of reducing leak currents in PN junctions, methods of forming films having fixed charge in PN junction portions have been reported (see Patent Literatures 1 and 2).

Incidentally, in the related art, PDs in pixels of solid-state imaging elements are formed in semiconductor substrates. In semiconductor substrates, however, elements performing driving are also formed. Therefore, when sizes of pixels are reduced, it is difficult to take the areas of PDs. In order to take countermeasures, forming photoelectric conversion films serving as PDs outside of semiconductor substrates has been proposed (see Non-Patent Literatures 1 and 2).

CITATION LIST

Patent Literature

Patent Literature 1: JP 2012-84902A
Patent Literature 2: JP 2013-89707A

Non-Patent Literature

Non-Patent Literature 1: "High-sensitivity Broadband Image Sensor using CuInGaSe2 Thin Films", O. Matsushima et al., IEDM Tech. Dig., 2008
Non-Patent Literature 2: "Thin Organic Photoconductive Film Image Sensors with Extremely High Saturation of 8500 electrons/μm2", M. Mori et al., Proc. VLSI Tech. Symp., 2013

SUMMARY OF INVENTION

Technical Problem

In such proposals, for example, photoelectric conversion films formed above semiconductor substrates are structured to be interposed between upper and lower electrodes. The lower electrodes are connected to floating diffusions (FDs) and gate electrodes of AMP_Tr. via wirings.

In such configurations, carriers (electrons or holes) generated in the photoelectric conversion films are immediately transmitted to the FDs to be accumulated in the FDs during an exposure period. Accordingly, it is necessary to suppress leakage currents occurring between FD portions and peripheral P__ Wells in PN junction depletion layers as much as possible, According to the present disclosure, it is desirable to reduce a leak current of a PN junction region.

Solution to Problem

According to an aspect of the present technology, there is provided a semiconductor device including: at least one of a negative fixed charge film that has negative fixed charge, extends from a P-type region to a depletion layer on a surface of a PN junction formed in a semiconductor substrate, and has a boundary located in the depletion layer in the PN junction and a positive fixed charge film that has positive fixed charge, extends from an N-type region to the depletion layer on the surface of the PN junction, and has a boundary located in the depletion layer in the PN junction.

The positive fixed charge film may be a plasma oxide film.
The positive fixed charge film may be a SiO2 film that contains nitrogen atoms.
The negative fixed charge film may be an oxide that contains at least one kind of element of hafnium, zirconium, aluminum, tantalum, titanium, yttrium, and lanthanoid.
The semiconductor device may be a solid-state imaging device, and the semiconductor device may further include: a floating diffusion region that is separated from a periphery using the PN junction in the semiconductor substrate; and a photoelectric conversion layer that is connected to the floating diffusion region via a conductive wiring.
The photoelectric conversion layer may be a chalcopyrite-based material.
The photoelectric conversion layer may be an organic material.
According to an aspect of the present technology, there is provided an electronic apparatus including: a solid-state imaging device that includes a floating diffusion region that is separated from a periphery using a PN junction in a semiconductor substrate, a photoelectric conversion layer that is connected to the floating diffusion region via a conductive wiring, and at least one of a negative fixed charge film that has negative fixed charge, extends from a P-type region to a depletion layer on a surface of the PN junction formed in the semiconductor substrate, and has a boundary located in the depletion layer in the PN junction and a positive fixed charge film that has positive fixed charge, extends from an N-type region to the depletion layer on the surface of the PN junction, and has a boundary located in the depletion layer in the PN junction; a signal processing circuit that processes an output signal output from the solid-state imaging device; and an optical system that causes incident light to be incident on the solid-state imaging device.

According to another aspect of the present technology, there is provided a semiconductor device including: at least one of a polysilicon gate that extends from a P-type region to a depletion layer on a surface of a PN junction formed in a semiconductor substrate and has a boundary located in the depletion layer in the PN junction and a polysilicon gate that extends from an N-type region to the depletion layer on the surface of the PN junction and has a boundary located in the depletion layer in the PN junction.

The semiconductor device may be a solid-state imaging device, and the semiconductor device may further include: a floating diffusion region that is separated from a periphery using the PN junction in the semiconductor substrate; and a photoelectric conversion layer that is connected to the floating diffusion region via a conductive wiring.

According to another aspect of the present technology, there is provided an electronic apparatus including: a solid-state imaging device that includes a floating diffusion region that is separated from a periphery using a PN junction in a semiconductor substrate, a photoelectric conversion layer that is connected to the floating diffusion region via a conductive wiring, and at least one of a polysilicon gate that extends from a P-type region to a depletion layer on a surface of the PN junction formed in the semiconductor substrate and has a boundary located in the depletion layer in the PN junction and a polysilicon gate that extends from an N-type region to the depletion layer on the surface of the PN junction and has a boundary located in the depletion layer in the PN junction; a signal processing circuit that processes an output signal output from the solid-state imaging device; and an optical system that causes incident light to be incident on the solid-state imaging device.

In an aspect of the present technology, at least one of a negative fixed charge film that has negative fixed charge, extends from a P-type region to a depletion layer on a surface of a PN junction formed in a semiconductor substrate, and has a boundary located in the depletion layer in the PN junction and a positive fixed charge film that has positive fixed charge, extends from an N-type region to the depletion layer on the surface of the PN junction, and has a boundary located in the depletion layer in the PN junction is included.

In another aspect of the present technology, at least one of a polysilicon gate that extends from a P-type region to a depletion layer on a surface of a PN junction formed in a semiconductor substrate and has a boundary located in the depletion layer in the PN junction and a polysilicon gate that extends from an N-type region to the depletion layer on the surface of the PN junction and has a boundary located in the depletion layer in the PN junction is included.

Advantageous Effects of Invention

According to the present technology, it is possible to manufacture a semiconductor device in which a PN junction is formed in a semiconductor substrate. According to the present technology, it is possible to reduce a leak current of a PN junction region.

In addition, the effects described in the present specification are not limiting but are merely examples, and there may be additional effects.

BRIEF DESCRIPTION OF DRAWINGS

FIG. 14 is a diagram illustrating comparison between leak current reduction ratios.

FIG. 24 is a block diagram illustrating a configuration example of an electronic apparatus to which the present technology is applied.

DESCRIPTION OF EMBODIMENT(S)

Hereinafter, modes for carrying out the present disclosure (hereinafter referred to as embodiments) will be described.
<Schematic Configuration Example of Solid-state Imaging Device>

Figure 1:
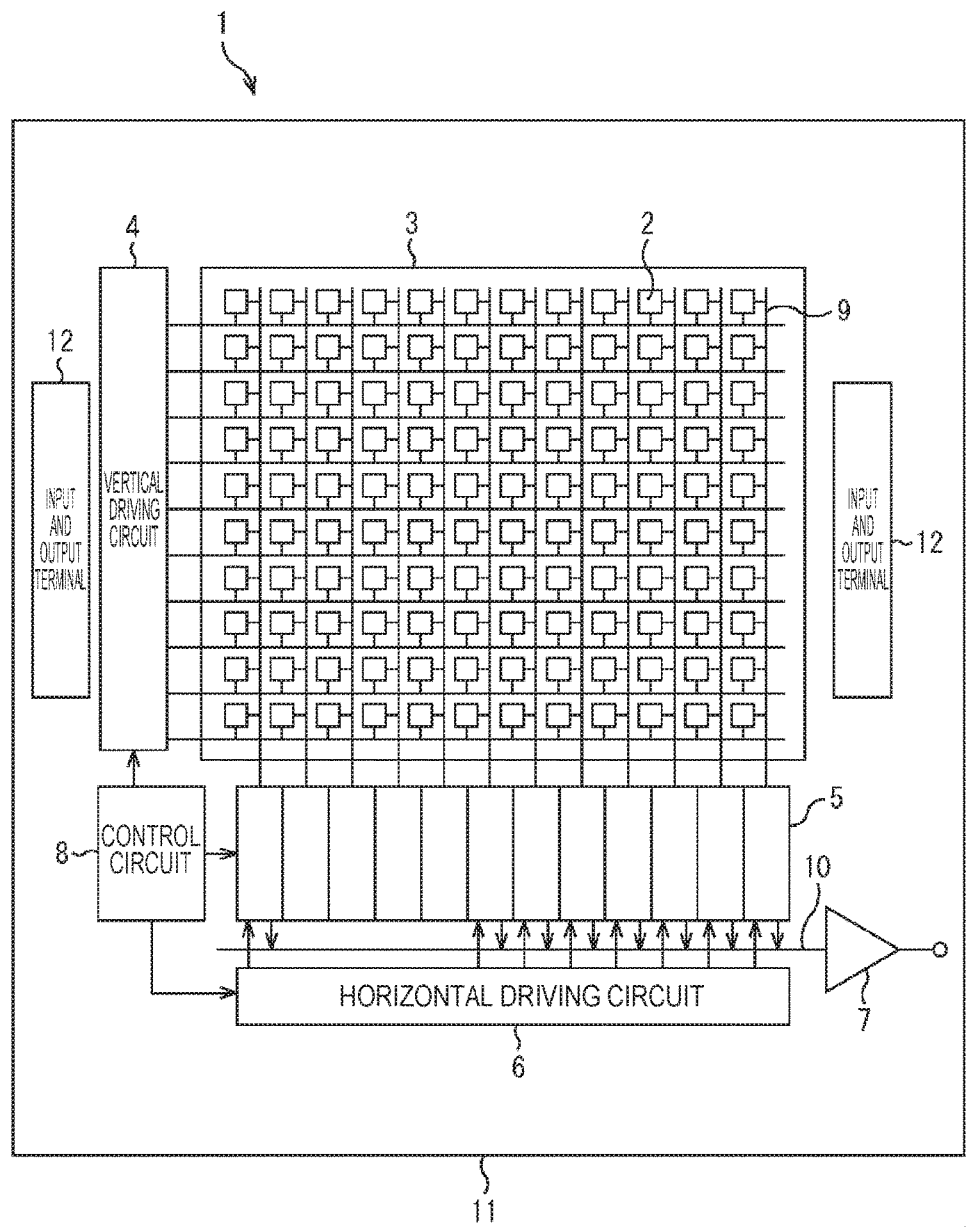
FIG. 1 is a block diagram illustrating a schematic configuration example of a solid-state imaging device to which the present technology is applied.

FIG. 1 illustrates a schematic configuration example of an example of a complementary metal oxide semiconductor (CMOS) solid-state imaging device which is applied to each embodiment of the present technology.

As illustrated in FIG. 1, a solid-state imaging device (element chip) 1 is configured to include a pixel region (so-called imaging region) 3 in which a plurality of pixels 2 including photoelectric conversion elements are regularly arrayed 2-dimensionally in a semiconductor substrate 11 (for example, a silicon substrate) and a peripheral circuit unit.

The pixel 2 includes a photoelectric conversion element (for example, a photodiode) and a plurality of pixel transistors (so-called MOS transistors). The plurality of pixel transistors can be configured of, for example, three transistors: a transmission transistor, a reset transistor, and an amplification transistor and can also be configured of four transistors by further including a select transistor. The equivalent circuit of each pixel 2 (unit pixel) is the same as a general equivalent circuit, and thus the detailed description thereof will be omitted herein.

The pixel 2 can also be configured with a pixel sharing structure. The pixel sharing structure is configured of a plurality of photodiodes, a plurality of transmission transistors, one floating diffusion which is shared, and each other pixel transistor which is shared. The photodiode is a photoelectric conversion element.

The peripheral circuit unit is configured to include a vertical driving circuit 4, column signal processing circuits 5, a horizontal driving circuit 6, an output circuit 7, and a control circuit 8.

The control circuit 8 receives data instructing an input clock, an operation mode, and the like and outputs data such as internal information of the solid-state imaging device 1. Specifically, the control circuit 8 generates clock signals or control signals serving as operation standards of the vertical driving circuit 4, the column signal processing circuits 5, and the horizontal driving circuit 6 based on a vertical synchronization signal, a horizontal synchronization signal, and a master clock. The control circuit 8 inputs such signals to the vertical driving circuit 4, the column signal processing circuit 5, and the horizontal driving circuit 6.

The vertical driving circuit 4 is configured of, for example, a shift register, selects pixel driving wirings, supplies pulses for driving the pixels 2 to the selected pixel driving wirings, and drives the pixels 2 in units of rows. Specifically, the vertical driving circuit 4 selectively scans the pixels 2 of the pixel region 3 in sequence in the vertical direction in units of rows and supplies the column signal processing circuits 5 with pixel signals based on signal charges generated according to reception amounts in the photoelectric conversion elements of the pixels 2 via vertical signal lines 9.

The column signal processing circuit 5 is disposed, for example, at each column of the pixels 2 and performs signal processing such as noise removal on signals output from the pixels 2 corresponding to one row for each pixel column. Specifically, the column signal processing circuit 5 performs signal processing such as correlated double sampling (CDS) for removing fixed pattern noise unique to the pixels 2, signal amplification, and analog/digital (A/D) conversion. A horizontal select switch (not illustrated) is connected to a horizontal signal line 10 to be installed at an output end of the column signal processing circuit 5.

The horizontal driving circuit 6 is configured of, for example, a shift register, selects the column signal processing circuits 5 in sequence by outputting the horizontal scanning pulses in sequence, and outputs pixel signals from the column signal processing circuits 5 to the horizontal signal line 10.

The output circuit 7 performs signal processing on signals supplied in sequence from the column signal processing circuits 5 via the horizontal signal line 10 and outputs the signals. For example, the output circuit 7 performs only buffering in some cases and performs black level adjustment, column variation correction, and various kinds of digital signal processing in some cases.

The input and output terminals 12 are installed to exchange signals with the outside.

Here, in the related art, photodiodes in pixels of a solid-state imaging element are formed in a semiconductor substrate. However, elements performing driving are also formed in the semiconductor substrate. Therefore, when the sizes of the pixels are small, it is difficult to take the areas of photodiodes. In order to take countermeasures, as illustrated in FIG. 2, a photoelectric conversion film serving as the photodiode is formed outside semiconductor substrate.
<Configuration Example of Pixel>

Figure 2:
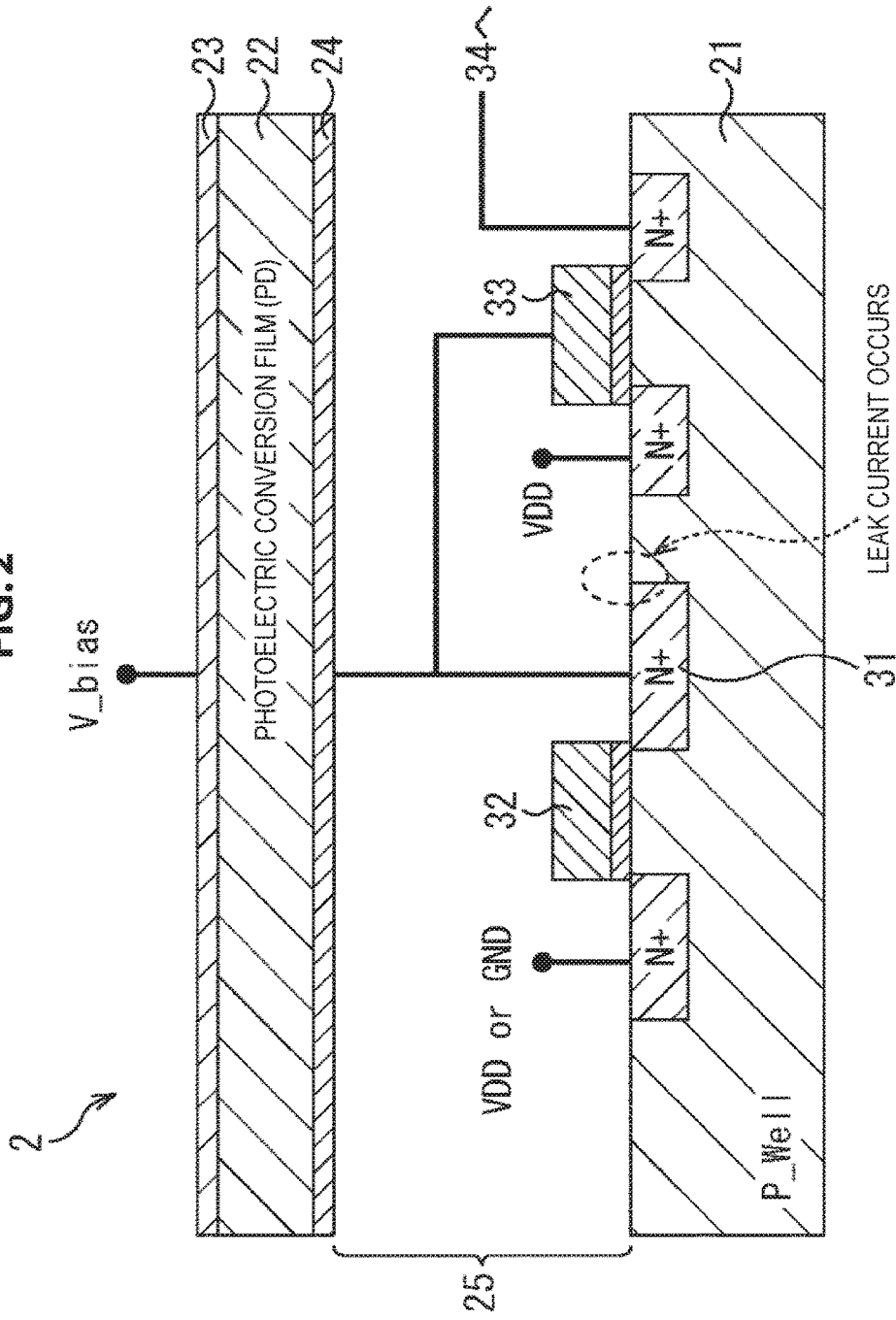
FIG. 2 is a sectional view illustrating a configuration example of a pixel.
Figure 3:
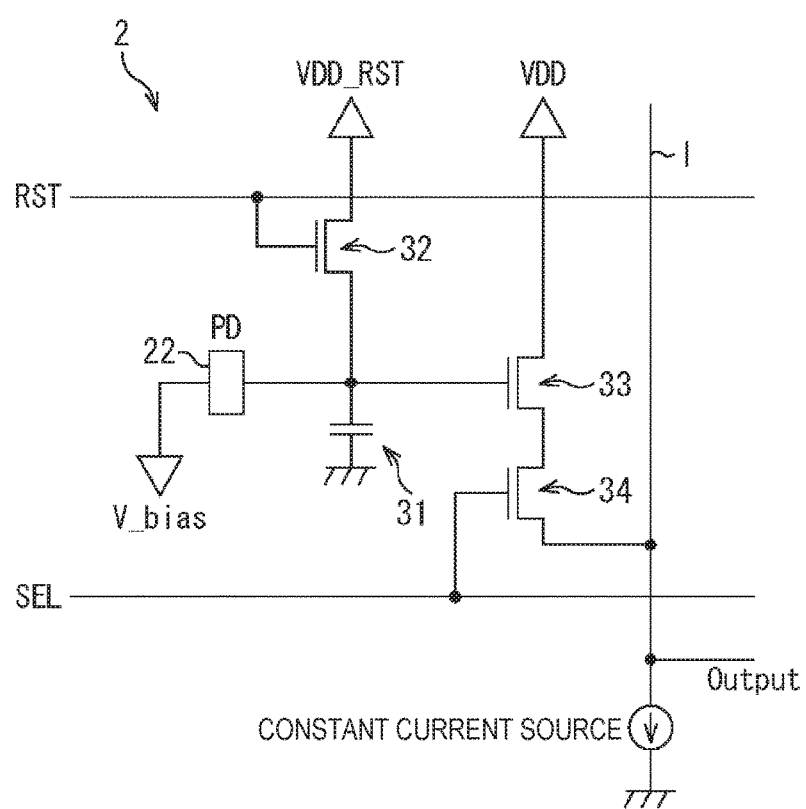
FIG. 3 is a circuit diagram illustrating a configuration example of a pixel.

FIG. 2 is a sectional view illustrating a simplified configuration of the pixel. FIG. 3 is a circuit diagram illustrating the pixel.

The pixel 2 is configured to include a semiconductor substrate 21, a photoelectric conversion film (photodiode (PD)) 22, an upper electrode 23, a lower electrode 24, and a wiring layer 25.

On the surface of the semiconductor substrate 21, circuits such as a floating diffusion (FD) 31, an RST_Tr. 32, and an AMP_Tr. 33 are formed by implanting N-type impurities into P_Well regions formed in the semiconductor substrate 21.

The photoelectric conversion film 22 formed above the semiconductor substrate 21 is structured to be interposed between the upper electrode 23 and the lower electrode 24. The lower electrode 24 is connected to the FD 31 formed on the semiconductor substrate 21 and the gate electrode of the AMP_Tr. 33 via wirings.

The photoelectric conversion film 22 may be organic or inorganic.

In such a configuration, carriers (electrons or holes) generated in the photoelectric conversion film 22 are immediately transmitted to the FD 31 and are accumulated in the FD 31 during an exposure period. Accordingly, it is necessary to suppress a leak current in a PN junction depletion layer (not illustrated) formed between the FD 31 and a peripheral P_Well region as much as possible.
<Example of PN Junction According to the Present Technology>

Figure 4:
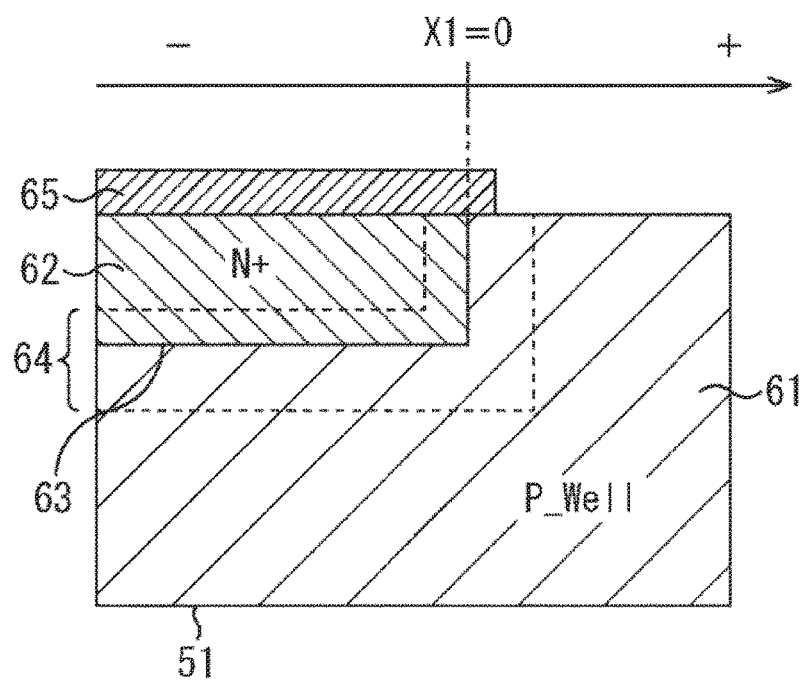
FIG. 4 is a diagram illustrating a first embodiment of the structure of a PN junction to which the present technology is applied.

FIG. 4 is a diagram illustrating a first embodiment of the structure of a PN junction to which the present technology is applied. As illustrated in the example of FIG. 4, an N+ region is formed in a P-type Well (P_Well region) in a Si substrate (semiconductor substrate) 51.

As illustrated in FIG. 4, a depletion layer 64 is formed in the circumference of a boundary (metallurgic boundary of a PN junction) 63 between the P_Well region 61 and an N+ region 62. In the case of the example of FIG. 4, on the surface of the Si substrate 51, a fixed charge layer 65 having positive fixed charge is formed on the N+ region 62 to be spanned to the depletion layer 64. The fixed charge layer is a layer formed of a fixed charge film.

Figure 5:
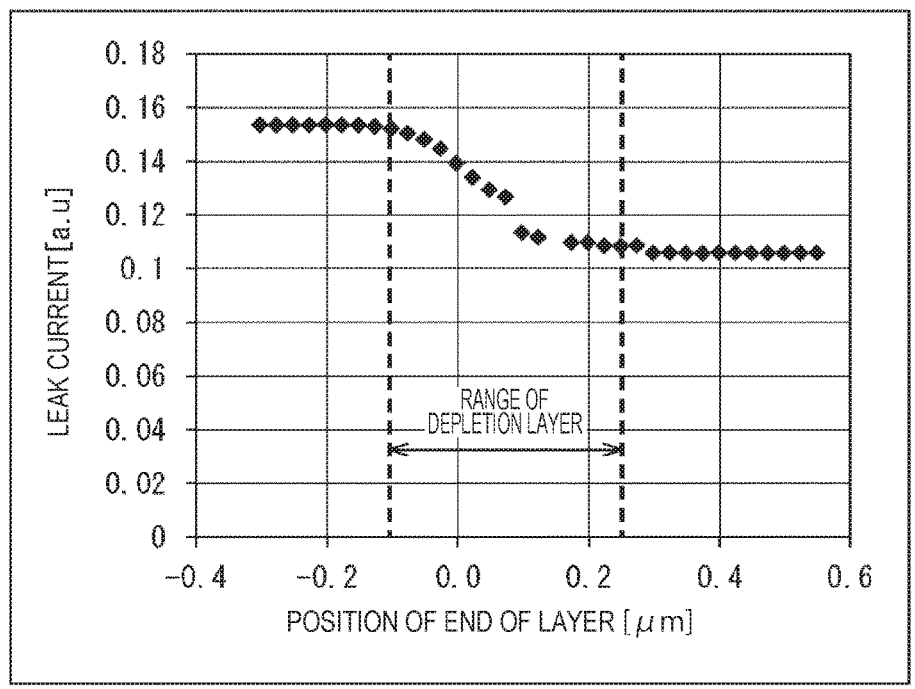
FIG. 5 is a diagram illustrating values of a leak current in the case of FIG. 4.

At this time, values of a leak current obtained in a simulation when the position of an end of the positive fixed charge layer 65 is moved as x1 on the surface of the Si substrate 51 are illustrated in FIG. 5.

In the example of FIG. 5, the horizontal axis represents the position of the right end of the positive fixed charge layer 65 and the vertical axis represents a leak current. Here, when x1=0, the end of the positive fixed charge layer 65 is exactly located at the boundary 63 of the PN junction of the Si substrate 51.

In the simulation, the concentration of the N+ region 62 is set to about $1e19$ cm$^{-3}$, the concentration of the P_Well region is set to about $1e17$ cm$^{-3}$, and positive fixed charge is set in the interface between the Si substrate 51 and the fixed charge layer 65. In the example of FIG. 5, a range of the depletion layer 64 is indicated by a dotted line.

At this time, when the right end x1 of the positive fixed charge layer 65 is a negative value, that is, the right end x1 of the positive fixed charge layer 65 is closer to the side of the N+ region 62 than the position of the PN junction, a leak current occurs. However, when the right end x1 of the positive fixed charge layer 65 is spanned to the depletion layer 64, the leak current reduces.

Further, at a certain location in the depletion layer 64 at which the end of the positive fixed charge layer 65 moves beyond the metallurgic boundary 63 of the PN junction, it can be understood that the reduction in the leak current stops. Accordingly, when the positive fixed charge layer 65 extending from the region 62 is formed up to the inside the depletion layer 64 formed by the original PN junction, the leak current can be sufficiently reduced. Then, a structure in which the positive fixed charge layer 65 extends up to the inside of the depletion layer 64 extending further than the boundary 63 of the PN junction can be understood to be an optimum structure capable of further reducing the leak current.

Figure 6:
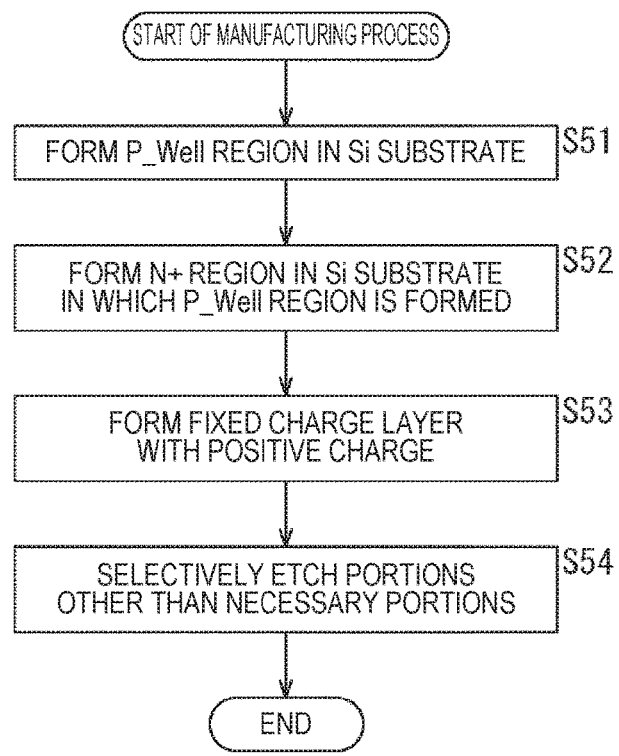
FIG. 6 is an explanatory flowchart illustrating a process of manufacturing the structure of FIG. 4.

Next, a process of manufacturing the structure illustrated in FIG. 4 will be described with reference to the flowchart of FIG. 6. This process is a process performed by a manufacturing apparatus (not illustrated).

In step S51, the manufacturing apparatus forms the P_Well region 61 in the Si substrate 51. In step S52, the manufacturing apparatus forms the N+ region 62 in the Si substrate 51 in which the P_Well region 61 is formed in step S51.

In step S53, the manufacturing apparatus forms the positive fixed charge layer 65 having positive charge. The positive fixed charge layer 65 is formed of a SiO2 film containing N or a plasma oxide film formed at a temperature equal to or less than 400 degrees.

In step S54, after the manufacturing apparatus forms the positive fixed charge layer 65 in step S53, the manufacturing apparatus selectively etches portions other than necessary portions using photolithography or dry etching.

The structure illustrated in FIG. 4 is completed through the above-described process.

<Another Example of PN Junction According to the Present Technology>

Figure 7:
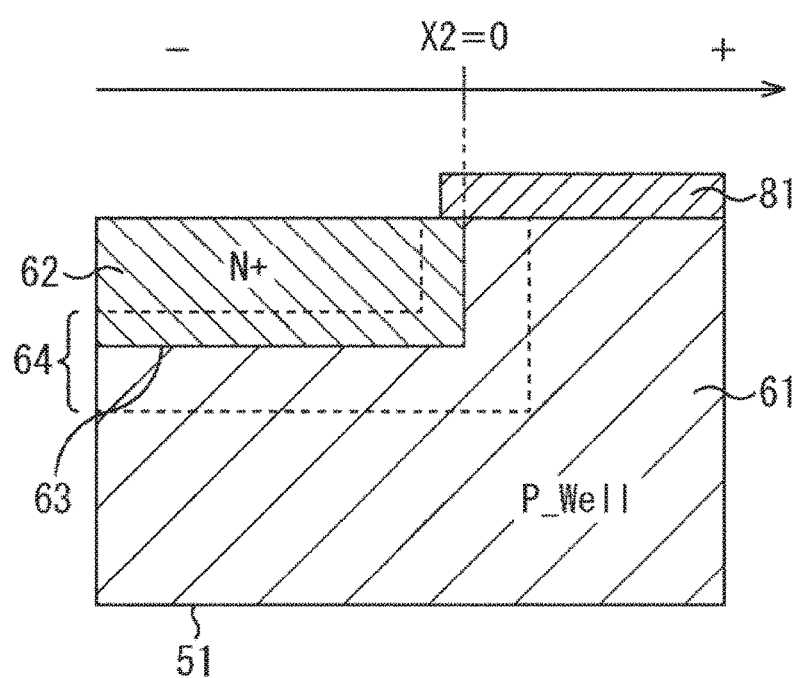
FIG. 7 is a diagram illustrating a second embodiment of the structure of a PN junction to which the present technology is applied.

FIG. 7 is a diagram illustrating a second embodiment of the structure of the PN junction to which the present technology is applied. As illustrated in the example of FIG. 7, as in the example of FIG. 4, an N+ region is formed in a P-type Well (P_Well region) in a Si substrate 51. A depletion layer 64 is formed in the circumference of a boundary 63 between the P_Well region 61 and an N+ region 62.

In the case of the example of FIG. 7, on the surface of the Si substrate 51, a negative fixed charge layer 81 having negative fixed charge is formed on the P_Well region 61 to be spanned to the depletion layer 64.

Figure 8:
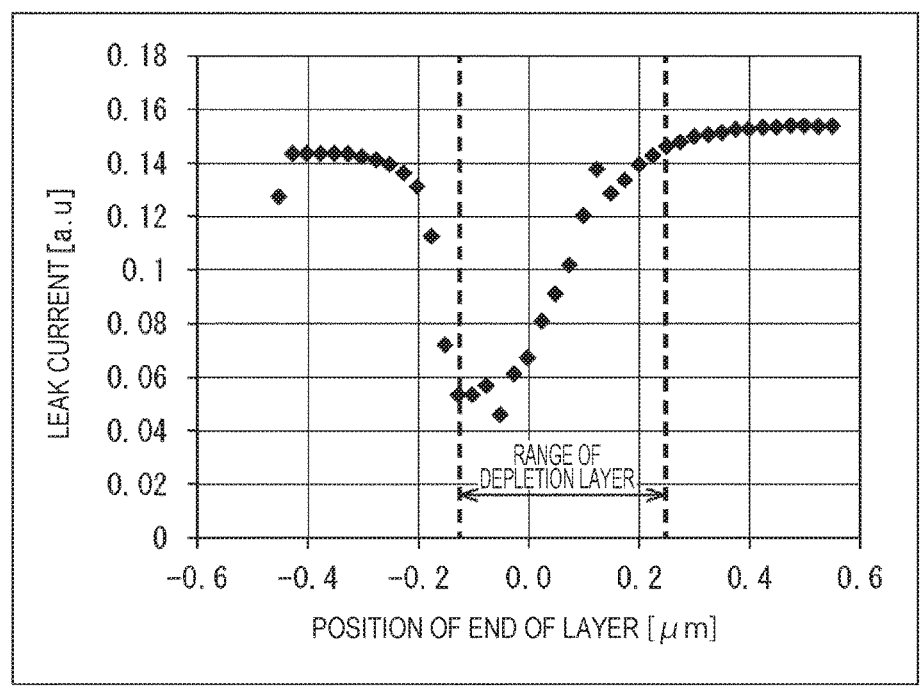
FIG. 8 is a diagram illustrating values of a leak current in the case of FIG. 7.

At this time, values of a leak current obtained in a simulation when the position of an end of the negative fixed charge layer 81 is moved as x2 on the surface of the Si substrate 51 are illustrated in FIG. 8.

In the example of FIG. 8, the horizontal axis represents the position of the left end of the negative fixed charge layer 81 and the vertical axis represents a leak current. Here, when x2=0, the end of the negative fixed charge layer 81 is exactly located at the boundary 63 of the PN junction of the Si substrate 51.

In the simulation, the concentration of the N+ region 62 is set to about $1e19$ cm$^{-3}$, the concentration of the P_Well region is set to about $1e17$ cm$^{-3}$, and negative fixed charge is set in the interface between the Si substrate 51 and the negative fixed charge layer 81. In the example of FIG. 8, a range of the depletion layer 64 is indicated by a dotted line.

At this time, when the right end x2 of the negative fixed charge layer 81 is a positive value, that is, the left end x2 of the negative fixed charge layer 81 is closer to the side of the P_Well region 61 than the position of the PN junction, a leak current occurs. However, when the left end x2 of the negative fixed charge layer 81 is spanned to the depletion layer 64, the leak current reduces.

At a certain location in the depletion layer 64 at which the left end of the negative fixed charge layer 81 moves beyond the metallurgic boundary 63 of the PN junction, it can be understood that the reduction in the leak current stops. Further, when the left end of the negative fixed charge layer 81 is spanned to the N+ region 62 beyond the depletion layer 64, the leak current increases again. Accordingly, it is necessary to form the negative fixed charge layer 81 from the P_Well region 61 to the depletion layer 64. Then, a structure in which the negative fixed charge layer 81 extending further than the boundary 63 and formed to be located inside depletion layer 64 of the PN junction can be understood to be an optimum structure capable of further reducing the leak current.

For example, this is because the layer having the fixed charge is formed on the entire surface including the depletion layer or is formed to extend up to the outside beyond the depletion layer. In the embodiment, the end of the layer having positive fixed charge and extending from the N region or the end of the layer having negative fixed charge and extending from the P region is formed to remain in the depletion layer, and more preferably, is formed to be located in the depletion layer beyond the metallurgic PN boundary. Thus, it is possible to reduce the leak current.

Figure 9:
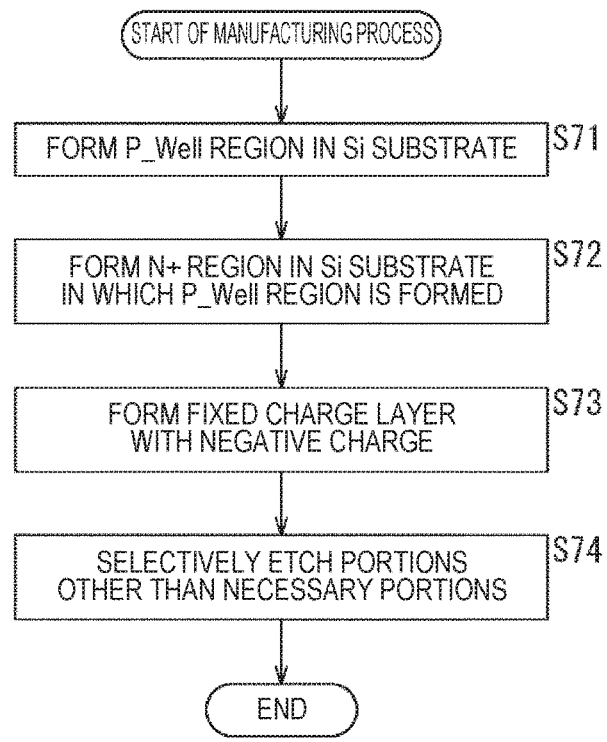
FIG. 9 is an explanatory flowchart illustrating a process of manufacturing the structure of FIG. 7.

Next, a process of manufacturing the structure illustrated in FIG. 7 will be described with reference to the flowchart of FIG. 9. This process is a process performed by a manufacturing apparatus (not illustrated).

In step S71, the manufacturing apparatus forms the P_Well region 61 in the Si substrate 51. In step S72, the manufacturing apparatus forms the N+ region 62 in the Si substrate 51 in which the P_Well region 61 is formed in step S71.

In step S73, the manufacturing apparatus forms the negative fixed charge layer 81 having negative charge. The negative fixed charge layer 81 is formed of an oxide insulation film containing at least one kind of element selected from hafnium, zirconium, aluminum, tantalum, titanium, yttrium, lanthanoid, and the like. The negative fixed charge layer 81 is formed with about 0.5 nm to about 50 nm on the surface using, for example, an atomic layer deposition method (ALD method).

In step S74, after the manufacturing apparatus forms the negative fixed charge layer 81 in step S73, the manufacturing apparatus selectively etches portions other than necessary portions using photolithography or dry etching.

The structure illustrated in FIG. 7 is completed through the above-described process.

Figure 10:
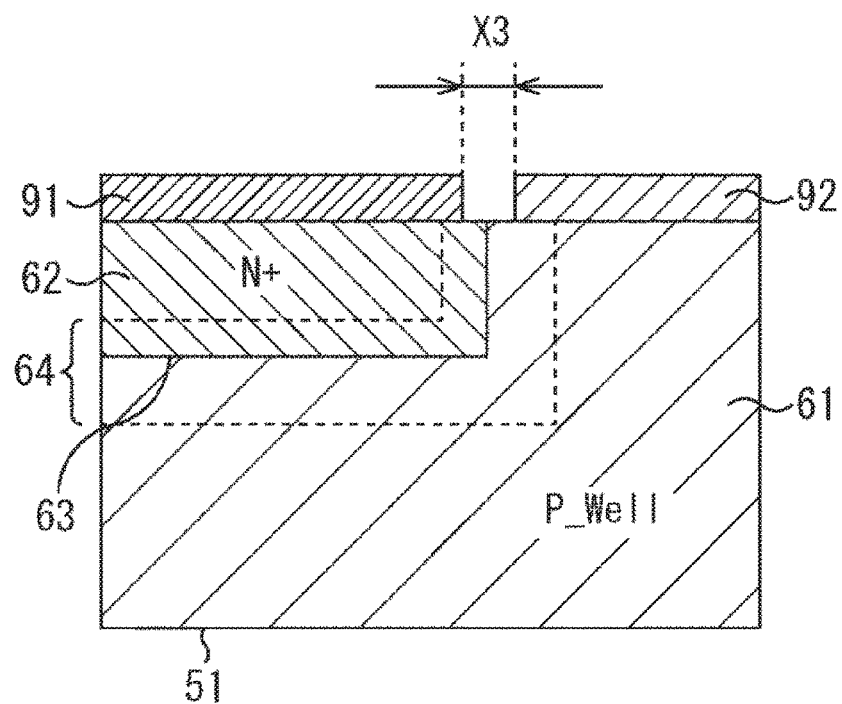
FIG. 10 is a diagram illustrating a third embodiment of the structure of a PN junction to which the present technology is applied.

FIG. 10 is a diagram illustrating a third embodiment of the structure of the PN junction to which the present technology is applied. As illustrated in the example of FIG. 10, as in the example of FIG. 4, an N+ region is formed in a P-type Well (P_Well region) in a Si substrate 51. A depletion layer 64 is formed in the circumference of a boundary 63 between the P_Well region 61 and an N+ region 62.

In the case of the example of FIG. 10, on the surface of the Si substrate 51, a positive fixed charge layer 91 having positive fixed charge and extending to the depletion layer 64 is formed on the N+ region 62, and a negative fixed charge layer 92 having negative fixed charge and extending to the depletion layer 64 is formed on the P_Well region 61.

Figure 11:
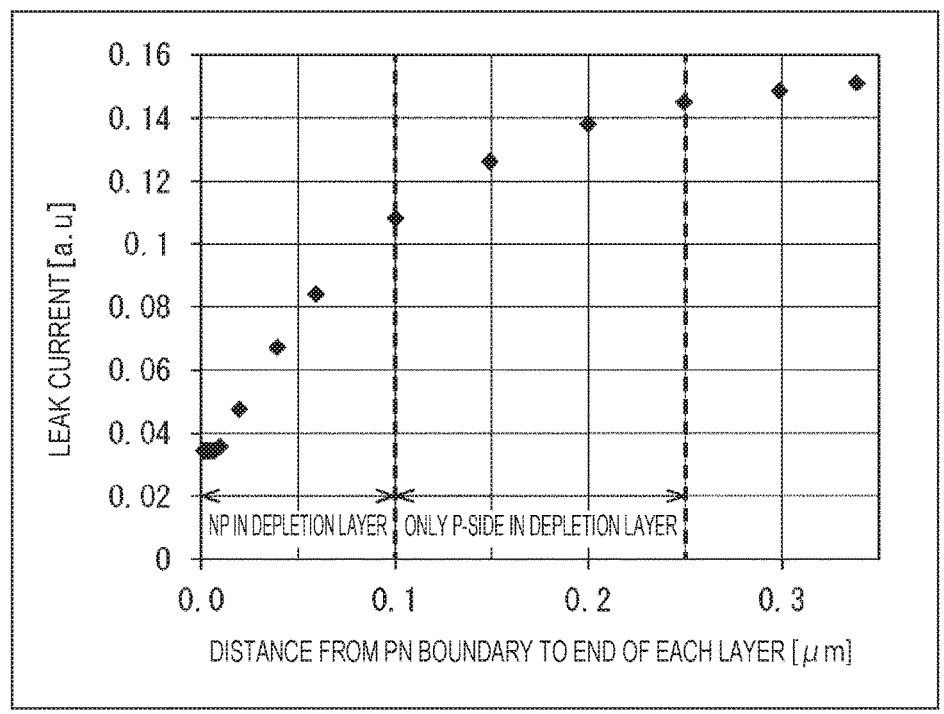
FIG. 11 is a diagram illustrating values of a leak current in the case of FIG. 10.

At this time, values of a leak current obtained in a simulation when a distance x3 of an interval between the positive fixed charge layer 91 and the negative fixed charge layer 92 is changed as x3 are illustrated in FIG. 11.

In the example of FIG. 11, the horizontal axis represents the distance from the boundary 63 of the PN junction to the end of each layer (the right end of the positive fixed charge layer 91 and the left end of the negative fixed charge layer 92) and the vertical axis represents a leak current. Here, when x3=0, the right end of the positive fixed charge layer 91 and the left end of the negative fixed charge layer 92 are each located in the boundary 63 and x3 is increased therefrom, the right end of the positive fixed charge layer 91 and the left end of the negative fixed charge layer 92 are assumed to be at an equal distance from the boundary 63.

From this result, if the leak current starts decreasing from when the negative fixed charge layer 92 extending from the P_Well region 61 enters the depletion layer 64 and the positive fixed charge layer 91 extending from the N+ region 62 enters the depletion layer 64, it can be understood that the leak current further decreases.

As described above, it can be understood that it is possible to obtain the advantage of reducing the leak current when the right end of the positive fixed charge layer 91 and the left end of the negative fixed charge layer 92 are located in the depletion layer 64.

Figure 12:
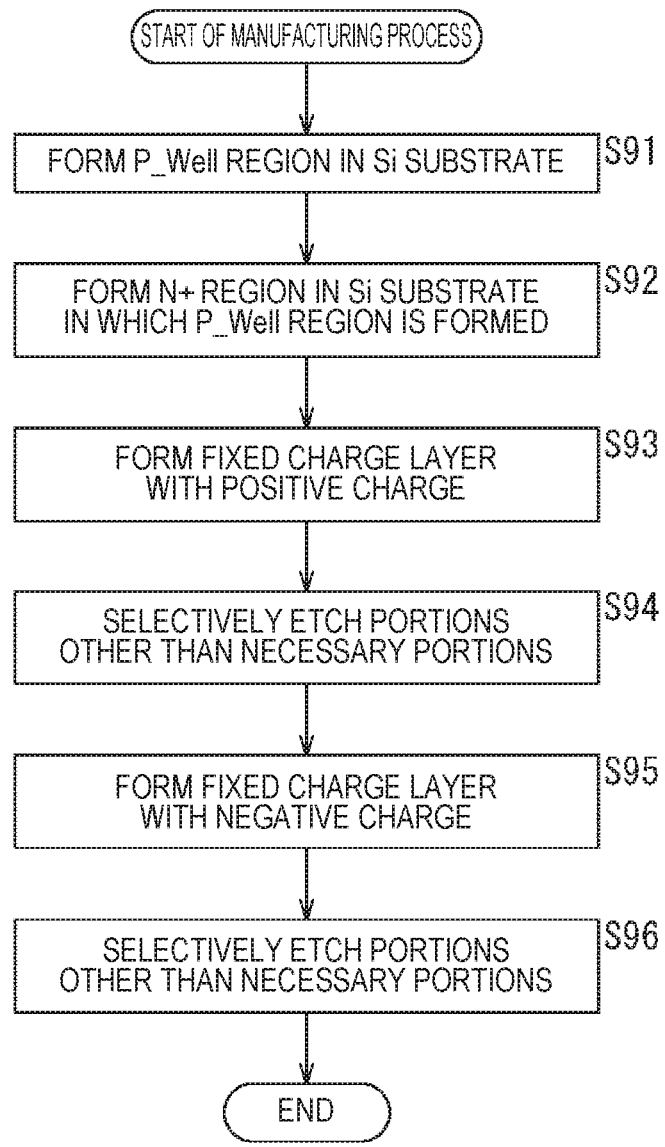
FIG. 12 is an explanatory flowchart illustrating a process of manufacturing the structure of FIG. 10.

Next, a process of manufacturing the structure illustrated in FIG. 10 will be described with reference to the flowchart of FIG. 12. This process is a process performed by a manufacturing apparatus (not illustrated).

In step S91, the manufacturing apparatus forms the P_Well region 61 in the Si substrate 51. In step S92, the manufacturing apparatus forms the N+ region 62 in the Si substrate 51 in which the P_Well region 61 is formed in step S71.

In step S93, the manufacturing apparatus forms the positive fixed charge layer 91 having positive charge. The positive fixed charge layer 91 is formed of a SiO2 film containing N or a plasma oxide film formed at a temperature equal to or less than 400 degrees.

In step S94, after the manufacturing apparatus forms the positive fixed charge layer 91 in step S93, the manufacturing apparatus selectively etches portions other than necessary portions using photolithography or dry etching.

In step S95, the manufacturing apparatus forms the negative fixed charge layer 92 having negative charge. The negative fixed charge layer 92 is formed of an oxide insulation film containing at least one kind of element selected from hafnium, zirconium, aluminum, tantalum, titanium, yttrium, lanthanoid, and the like. The negative fixed charge layer 92 is formed with about 0.5 nm to about 50 nm on the surface using, for example, an atomic layer deposition method (ALD method).

In step S96, after the manufacturing apparatus forms the negative fixed charge layer 92 in step S95, the manufacturing apparatus selectively etches portions other than necessary portions using photolithography or dry etching.

The structure illustrated in FIG. 10 is completed through the above-described process.

In the example of FIG. 10, the example in which the positive fixed charge layer is formed first has been described, but the negative fixed charge layer may be formed first. As modification of the structure illustrated in FIG. 10, as illustrated in A of FIG. 13 and B of FIG. 13, one fixed charge layer can also be formed astride the other fixed charge layer.

MODIFICATION EXAMPLES

Figure 13:
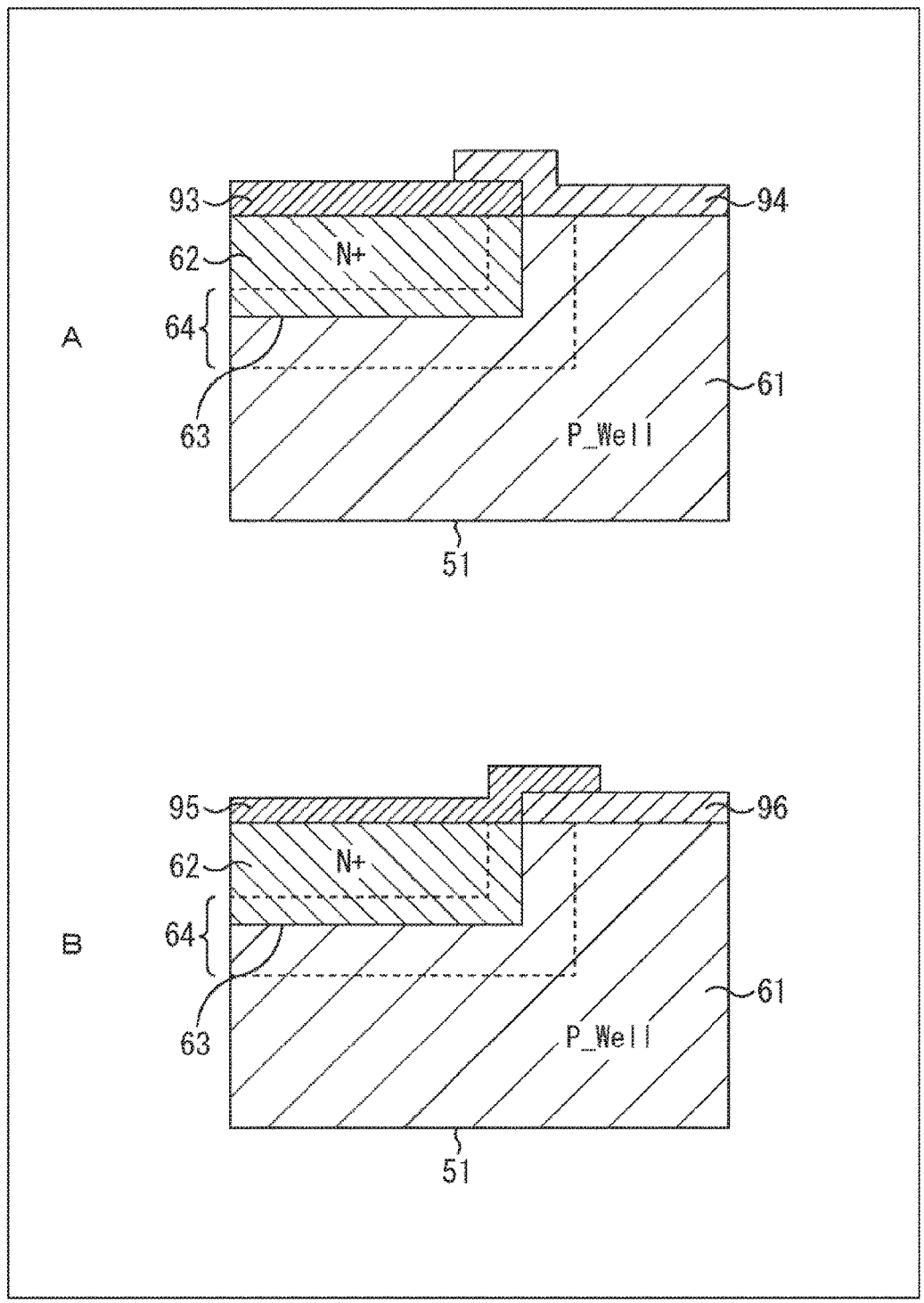
FIG. 13 is a diagram illustrating a modification example of the structure of the PN junction of FIG. 10.

FIG. 13 is a diagram illustrating a modification example of the structure of the PN junction of FIG. 10. In the example of FIG. 13, as in the example of FIG. 4, an N+ region is formed in a P-type Well (P_Well region) in a Si substrate 51. A depletion layer 64 is formed in the circumference of a boundary 63 between the P_Well region 61 and an N+ region 62.

In the example of A of FIG. 13, on the surface of the Si substrate 51, a positive fixed charge layer 93 having positive fixed charge and extending up to the boundary 63 of the depletion layer 64 is formed on the N+ region 62, and a negative fixed charge layer 94 having negative fixed charge is formed astride the positive fixed charge layer 93 from the P_Well region 61 beyond the boundary 63 of the depletion layer 64.

A destination at which the negative fixed charge layer 94 is formed astride may be a portion above the positive fixed charge layer 93 beyond the depletion layer 64.

In the example of B of FIG. 13, on the surface of the Si substrate 51, a negative fixed charge layer 96 having negative fixed charge and extending up to the boundary 63 of the depletion layer 64 is formed on the P_Well region 61, and a fixed charge layer 95 having positive fixed charge is formed astride the negative fixed charge layer 96 from the N+ region 62 beyond the boundary 63 of the depletion layer 64.

A destination at which the positive fixed charge layer 95 is formed astride may be a portion above the negative fixed charge layer 96 beyond the depletion layer 64.

<Comparison Between Leak Current Reduction Ratios>

FIG. 14 is a diagram illustrating comparison between leak current reduction ratios.

On the assumption that a leak current is set to 1 (standard) in a state in which there is no fixed charge layer on the interface (surface) of the PN junction, a leak current is 0.93 when a layer having negative fixed charge is attached to the entire surface of a depletion layer so that the depletion layer is covered. A reduction ratio is 7.1% in contrast with the case in which there is no fixed charge layer.

In contrast, when a positive fixed charge layer extending from an N+ region to a depletion layer is formed as in the first embodiment of the present technology (see FIG. 4), the leak current is 0.69 and the reduction ratio is 31.4% in contrast with the case in which there is no fixed charge layer.

When a negative fixed charge layer extending from a P_Well region to a depletion layer is formed as in the second embodiment of the present technology (see FIG. 7), the leak current is 0.35 and the reduction ratio is 65.3% in contrast with the case in which there is no fixed charge layer. Further, when a positive fixed charge layer and a negative fixed charge layer extend from both regions to a depletion layer as in the third embodiment of the present technology, the leak current is 0.22 and the reduction ratio is 77.5% in contrast with the case in which there is no fixed charge layer.

Here, referring back to FIG. 2, as described above, in the pixel having the structure in which the photoelectric conversion film 22 is installed outside of the semiconductor substrate 21 and is connected to the FD 31 on the semiconductor substrate 21 using the conductive wiring (the wiring layer 25), it is necessary to suppress the leak current in the PN junction interface of the FD 31 as much as possible.

Here, as the photoelectric conversion film 22 installed outside of the semiconductor substrate 21, an organic material or a compound semiconductor with a chalcopyrite structure can be used. As the chalcopyrite-based photoelectric conversion film, for example, a film formed of CuInSe2 or copper-aluminum-gallium-indium-sulfur-selenium-based mixed crystal can be used. In addition to the foregoing film, a compound semiconductor layer formed of a group III or a group IV may be used. As the organic material, for example, a material such as a quinacridone-based material or a coumarin-based material may be used. Further, an inorganic photoelectric conversion film (Quantam Film) with a quantum structure may be used. The photoelectric conversion film in the embodiment is merely an example and is not limited thereto.

In the photoelectric conversion film 22, a pair of electron and hole is formed by optical irradiation, but a carrier collected in the lower electrode 24 connected to the FD 31 may be either electron or hole. When electrons are collected, an opposite side of the RST_Tr. 32 to the FD 31 is connected to a VDD. When the FD is reset, the VDD is reset and electrons gather and a potential decreases.

Conversely, when holes are collected, the RST_Tr. 32 is set to a potential of the GND or a potential close to the GND. When the holes are transmitted to the FD 31, the holes recombine with electrons to disappear, and thus a potential increases. Accordingly, the potential of the region of the FD 31 increases immediately after a reset operation in the case of transmission of electrons and at the time of transmission of holes after resetting in the case of transmission of the holes, and thus a leak current more easily occurs in this state.

<Still Another Example of PN Junction According to the Present Technology>

Figure 15:
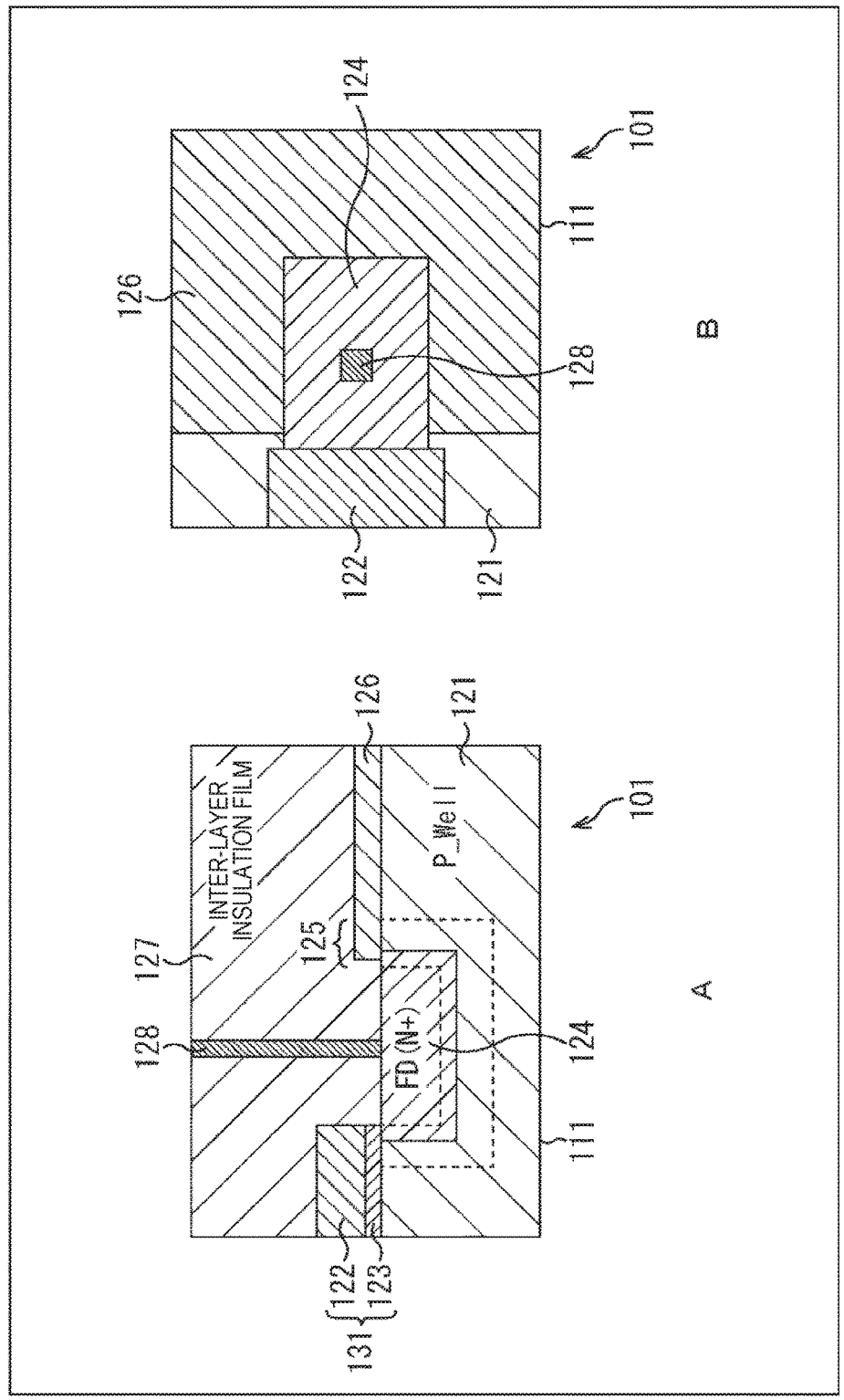
FIG. 15 is a diagram illustrating a fourth embodiment of the structure of a PN junction to which the present technology is applied.

FIG. 15 is a diagram illustrating a fourth embodiment of the PN junction to which the present technology is applied. A of FIG. 15 is a sectional view illustrating a simplified structure of a PN junction to which the present technology is applied. B of FIG. 15 is a plan view illustrating the structure of the PN junction to which the present technology is applied when viewed from the upper side.

The example of FIG. 15 is a combination of the second embodiment with FIG. 2 described above. That is, in a pixel 101 in the example of FIG. 15, a photoelectric conversion film is disposed outside a Si substrate (semiconductor substrate) 111. The photoelectric conversion film is configured to be connected to an FD 124 on the Si substrate 111 via a conductive wiring. In the example of FIG. 15, the photoelectric conversion film, an upper electrode, and a lower electrode are not illustrated.

In the pixel 101 in FIG. 15, circuits such as an FD 124 and an RST_Tr. 131 formed by a poly electrode 122 and a gate oxide film 123 are formed on the surface of the Si substrate 111 by implanting N-type impurities into a P_Well region 121 formed in the Si substrate 111.

The ED 124 is connected to the photoelectric conversion film interposed between the upper electrode and the lower electrode (not illustrated) via a connection wiring 128. The FD 124 is formed in an N+ region and a depletion layer 125 is formed between the FD 124 and the P_Well region 121.

In such a pixel 101, a negative fixed charge layer 126 is formed to extend from the p_Well region 121 to the depletion layer 125. A leak current occurring in a portion of the FD 124 can be reduced by this structure, that is, a function of the negative fixed charge layer 126 extending from the P_Well region 121 to the depletion layer 125.

In the example of B of FIG. 15, the negative fixed charge layer 126 may not be in contact with the poly electrode 122 so that a space is empty, but may be in contact with the poly electrode 122.

Figure 16:
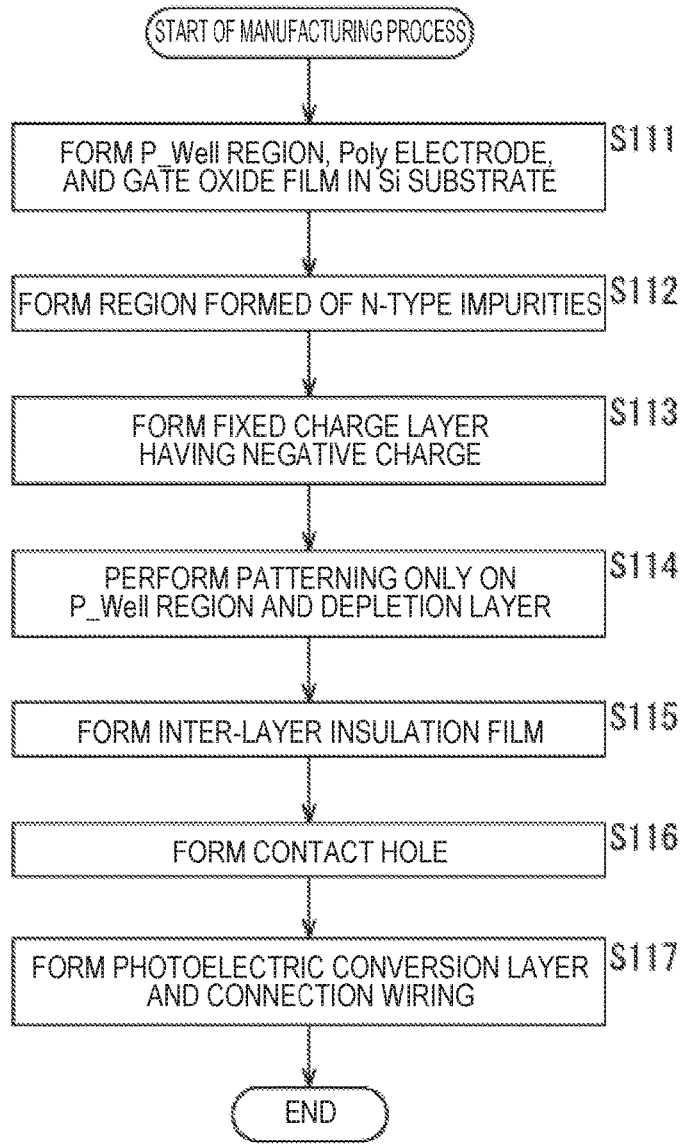
FIG. 16 is an explanatory flowchart illustrating a process of manufacturing the structure of FIG. 15.

Next, a process of manufacturing the pixel 101 illustrated in FIG. 15 will be described with reference to the flowchart of FIG. 16. This process is a process performed by a manufacturing apparatus (not illustrated).

In step S111, the manufacturing apparatus forms the P_Well region 121 and the poly electrode 122 and the gate oxide film 123 of the RST_Tr. 131 in the Si substrate 111. In step S112, the manufacturing apparatus forms the FD 124 formed of N-type impurities in the Si substrate 111 in which the P_Well region 121 and the like are formed in step S111.

In step S113, the manufacturing apparatus forms the negative fixed charge layer 126 having negative charge. The negative fixed charge layer 126 is formed of a SiO2 film containing N or a plasma oxide film formed at a temperature equal to or less than 400 degrees.

In step S114, the manufacturing apparatus performs patterning only on the P_Well region 121 and the depletion layer 125 after the negative fixed charge layer 65 is formed in step S113. In step S115, the manufacturing apparatus forms an inter-layer insulation film 127. In step S116, the manufacturing apparatus forms a contact hole in the inter-layer insulation film 127.

In step S116, the manufacturing apparatus forms the photoelectric conversion layer (not illustrated) and the connection wiring 128. Thus, the structure illustrated in FIG. 15 is completed.

A leak current occurring in a portion of the ED 124 can be reduced by this structure, that is, the function of the negative fixed charge layer 126 extending from the P_Well region 121 to the depletion layer 125.

Figure 17:
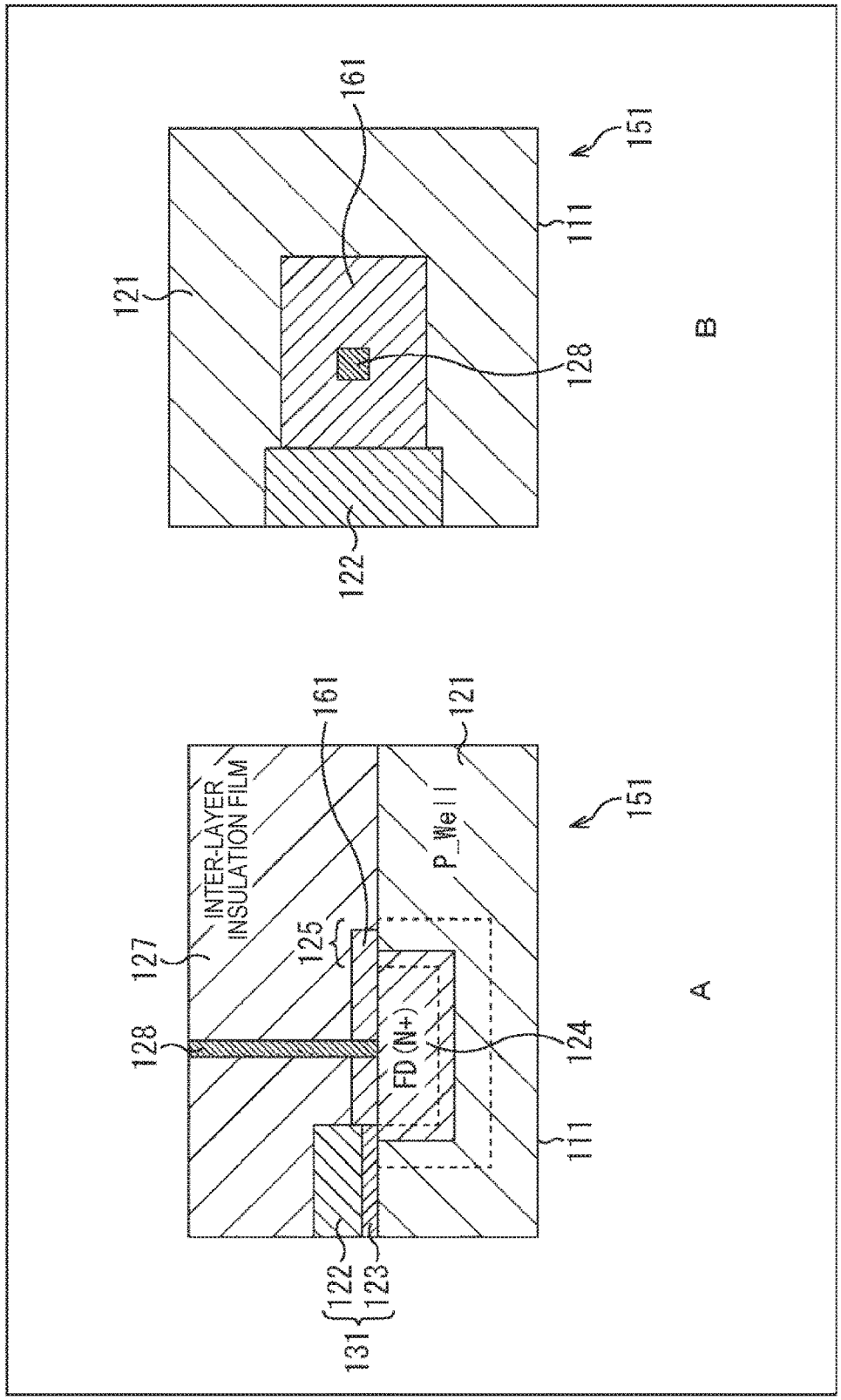
FIG. 17 is a diagram illustrating a fifth embodiment of the structure of a PN junction to which the present technology is applied.

FIG. 17 is a diagram illustrating a fifth embodiment of the PN junction to which the present technology is applied. A of FIG. 17 is a sectional view illustrating a simplified structure of a PN junction to which the present technology is applied. B of FIG. 17 is a plan view illustrating the structure of the PN junction to which the present technology is applied when viewed from the upper side.

The example of FIG. 17 is a combination of the first embodiment with FIG. 2 described above. That is, in a pixel 151 in the example of FIG. 17, a photoelectric conversion film is disposed outside a Si substrate 111. The photoelectric conversion film is configured to be connected to an FD 124 on the Si substrate 111 via a conductive wiring. In the example of FIG. 17, the photoelectric conversion film, an upper electrode, and a lower electrode are not illustrated.

In the pixel 151 in FIG. 17, circuits such as an FD 124 and an RST_Tr. 131 formed by a poly electrode 122 and a gate oxide film 123 are formed on the surface of the Si substrate 111 by implanting N-type impurities into a P_Well region 121 formed in the Si substrate 111.

The ED 124 is connected to the photoelectric conversion film interposed between the upper electrode and the lower electrode (not illustrated) via a connection wiring 128. The FD 124 is formed in an N+ region and a depletion layer 125 is formed between the FD 124 and the P_Well region 121.

In such a pixel 151, a positive fixed charge layer 161 is formed to extend from the ED 124 which is N+ region to the depletion layer 125. A leak current occurring in a portion of the FD 124 can be reduced by this structure, that is, a function of the positive fixed charge layer 161 extending from the FD 124 to the depletion layer 125.

In the pixel 151 in FIG. 17, the fixed charge layer having negative charge is substituted with the fixed charge layer having positive charge in the forming of step S113 of the process of manufacturing the pixel 101 described above with reference to FIG. 16. The other remaining process is basically the same. Accordingly, the process of manufacturing the pixel 151 in FIG. 17 will be omitted.

Figure 18:
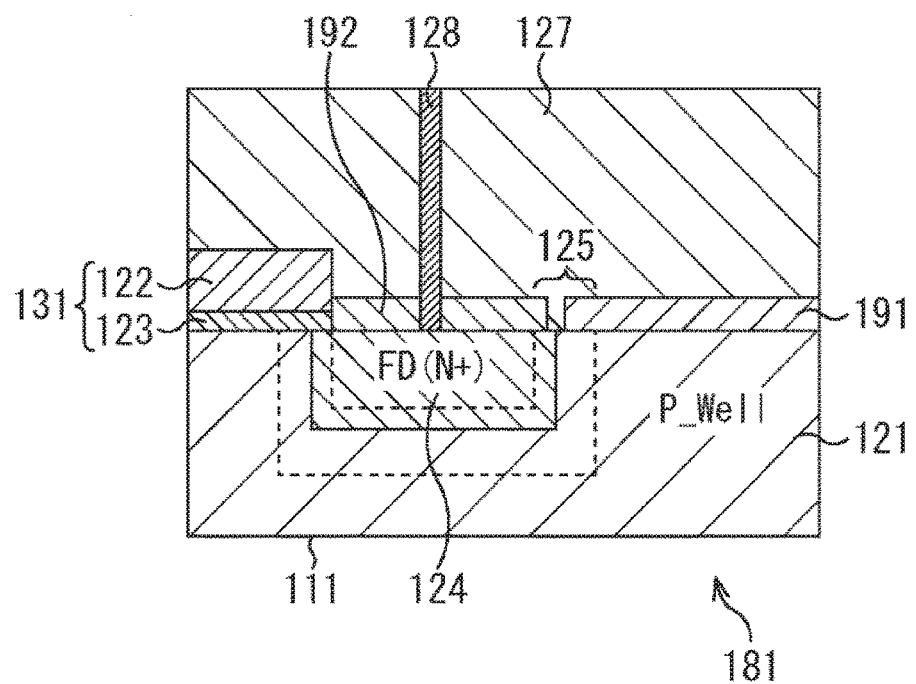
FIG. 18 is a diagram illustrating a sixth embodiment of the structure of a PN junction to which the present technology is applied.

FIG. 18 is a diagram illustrating a sixth embodiment of the structure of the PN junction to which the present technology is applied. FIG. 18 is a sectional view illustrating a simplified structure of a PN junction to which the present technology is applied.

The example of FIG. 18 is a combination of the third embodiment with FIG. 2 described above. That is, in a pixel 181 in the example of FIG. 18, a photoelectric conversion film is disposed outside a Si substrate 111. The photoelectric conversion film is configured to be connected to an FD 124 on the Si substrate 111 via a conductive wiring. In the example of FIG. 18, the photoelectric conversion film, an upper electrode, and a lower electrode are not illustrated.

In the pixel 181 in FIG. 18, circuits such as an FD 124 and an RST_Tr. 131 formed by a poly electrode 122 and a gate oxide film 123 are formed on the surface of the Si substrate 111 by implanting N-type impurities into a P_Well region 121 formed in the Si substrate 111.

The FD 124 is connected to the photoelectric conversion film interposed between the upper electrode and the lower electrode (not illustrated) via a connection wiring 128. The FD 124 is formed in an N+ region and a depletion layer 125 is formed between the FD 124 and the P_Well region 121.

In such a pixel 181, a negative fixed charge layer 191 is formed to extend from the P_Well region 121 to the depletion layer 125 and a positive fixed charge layer 192 is formed to extend from the FD 124 which is N+ region to the depletion layer 125. A leak current occurring in a portion of the FD 124 can be reduced by this structure, that is, functions of the negative fixed charge layer 191 extending from the P_Well region 121 to the depletion layer 125 and the positive fixed charge layer 192 extending from the FD 124 to the depletion layer 125.

In the example of FIG. 18, the negative fixed charge layer 191 and the positive fixed charge layer 192 are each formed to be spanned to the depletion layer 125, but the mutual layers do not have a stacked structure.

Figure 19:
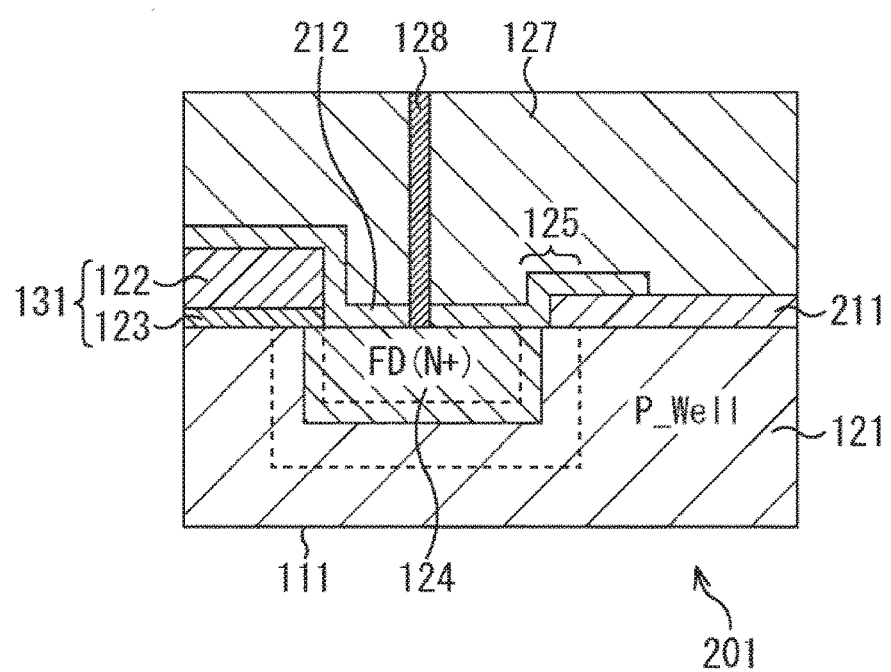
FIG. 19 is a diagram illustrating a seventh embodiment of the structure of a PN junction to which the present technology is applied.

FIG. 19 is a diagram illustrating a seventh embodiment of the structure of the PN junction to which the present technology is applied. FIG. 19 is a sectional view illustrating a simplified structure of a PN junction to which the present technology is applied.

The example of FIG. 19 is a combination of the modification example of the third embodiment with FIG. 2 described above. That is, in a pixel 181 in the example of FIG. 19, a photoelectric conversion film is disposed outside a Si substrate 111. The photoelectric conversion film is configured to be connected to an FD 124 on the Si substrate 111 via a conductive wiring. In the example of FIG. 19, the photoelectric conversion film, an upper electrode, and a lower electrode are not illustrated.

In the pixel 201 in FIG. 19, circuits such as an FD 124 and an RST_Tr. 131 formed by a poly electrode 122 and a gate oxide film 123 are formed on the surface of the Si substrate 111 by implanting N-type impurities into a P_Well region 121 formed in the Si substrate 111.

The FD 124 is connected to the photoelectric conversion film interposed between the upper electrode and the lower electrode (not illustrated) via a connection wiring 128. The FD 124 is formed in an N+ region and a depletion layer 125 is formed between the FD 124 and the P_Well region 121.

In such a pixel 201, a negative fixed charge layer 211 is formed to extend from the P_Well region 121 to the depletion layer 125 and a positive fixed charge layer 212 is formed astride the negative fixed charge layer 211 from the FD 124 which is N+ region beyond the depletion layer 125. A leak current occurring in a portion of the FD 124 can be reduced by this structure, that is, functions of the negative fixed charge layer 211 extending from the P_Well region 121 to the depletion layer 125 and the positive fixed charge layer 212 formed astride the negative fixed charge layer 211 from the FD 124 beyond the depletion layer 125.

<Another Example of PN Junction According to the Present Technology>

Figure 20:
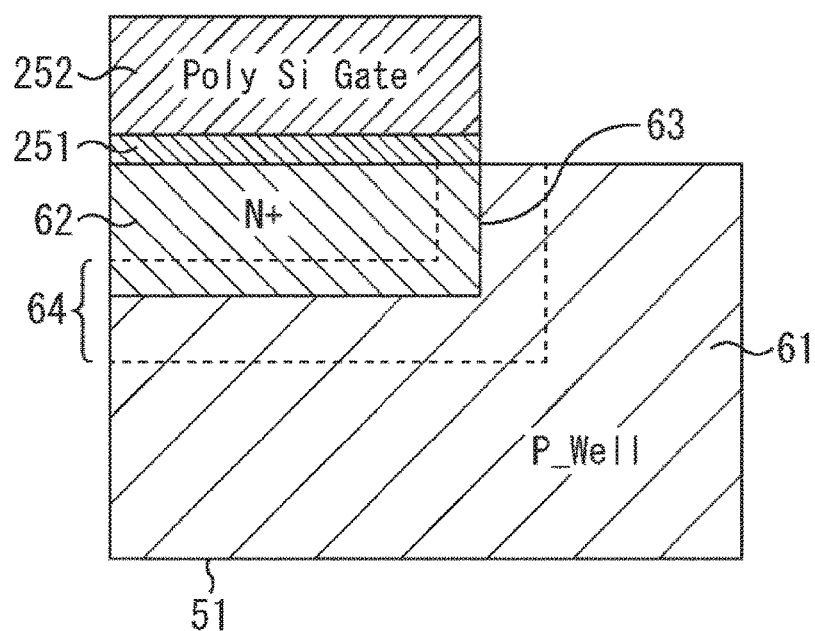
FIG. 20 is a diagram illustrating an eighth embodiment of the structure of a PN junction to which the present technology is applied.

FIG. 20 is a diagram illustrating an eighth embodiment of the structure of the PN junction to which the present technology is applied. In the example of FIG. 20, as in the example of FIG. 4, an N+ region is formed in a P-type Well (P_Well region) in a Si substrate 51. A depletion layer 64 is formed in the circumference of a boundary 63 between the P_Well region 61 and an N+ region 62.

In the case of the example of FIG. 20, on the surface of the Si substrate 51, the positive fixed charge layer 65 having positive fixed charge in FIG. 4 is substituted with a poly Si electrode (gate) 252 formed with a Si oxide film 251 interposed therebetween to be formed on the N+ region 62 to be spanned to the depletion layer 64.

At this time, the poly Si electrode 252 may contain either N-type or P-type impurities, but N-type poly Si is preferably formed on the N+ region 62. Then, a positive voltage is applied to the poly Si electrode 252 of the N+ region 62.

By appropriately adjusting this voltage, the potential of the Si surface as that of the fixed charge layer 65 in FIG. 4 can be generated. Thus, it is possible to obtain the same advantage of reducing a leak current as in the case in which the fixed charge layer 65 is formed.

Figure 21:
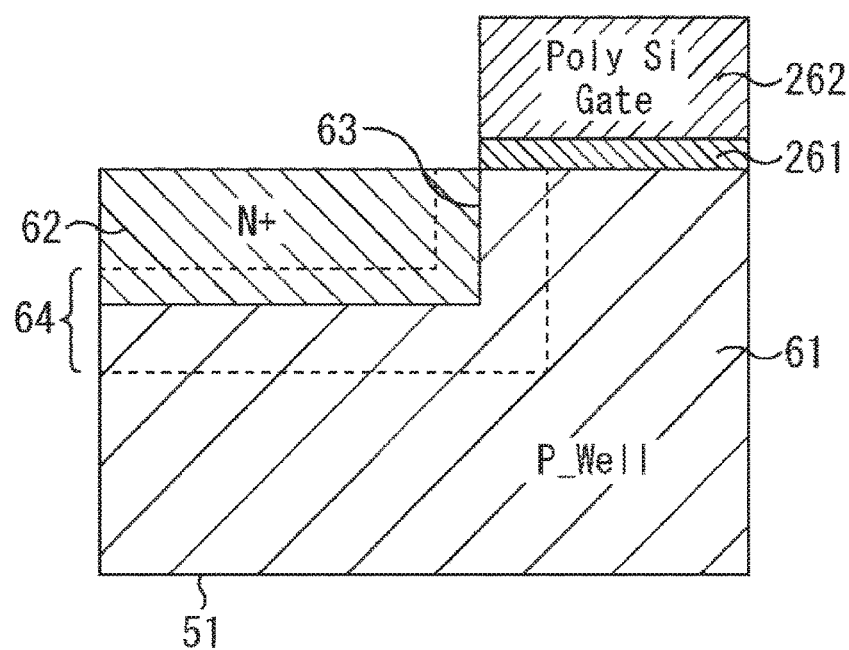
FIG. 21 is a diagram illustrating a ninth embodiment of the structure of a PN junction to which the present technology is applied.

FIG. 21 is a diagram illustrating a ninth embodiment of the structure of the PN junction to which the present technology is applied. In the example of FIG. 21, as in the example of FIG. 4, an N+ region is formed in a P-type Well (P_Well region) in a Si substrate 51. A depletion layer 64 is formed in the circumference of a boundary 63 between the P_Well region 61 and an N+ region 62.

In the case of the example of FIG. 21, on the surface of the Si substrate 51, the negative fixed charge layer 81 having negative fixed charge in FIG. 7 is substituted with a poly Si electrode (gate) 262 formed with a Si oxide film 261 interposed therebetween to be formed on the P_Well region 61 to be spanned to the depletion layer 64.

At this time, the poly Si electrode 262 may contain either N-type or P-type impurities, but P-type poly Si is preferably formed on the P_Well region 61. Then, a negative voltage is applied to the poly Si electrode 252 of the P_Well region 61.

By appropriately adjusting this voltage, the potential of the Si surface as that of the negative fixed charge layer 81 in FIG. 7 can be generated. Thus, it is possible to obtain the same advantage of reducing a leak current as in the case in which the negative fixed charge layer 81 is formed.

Figure 22:
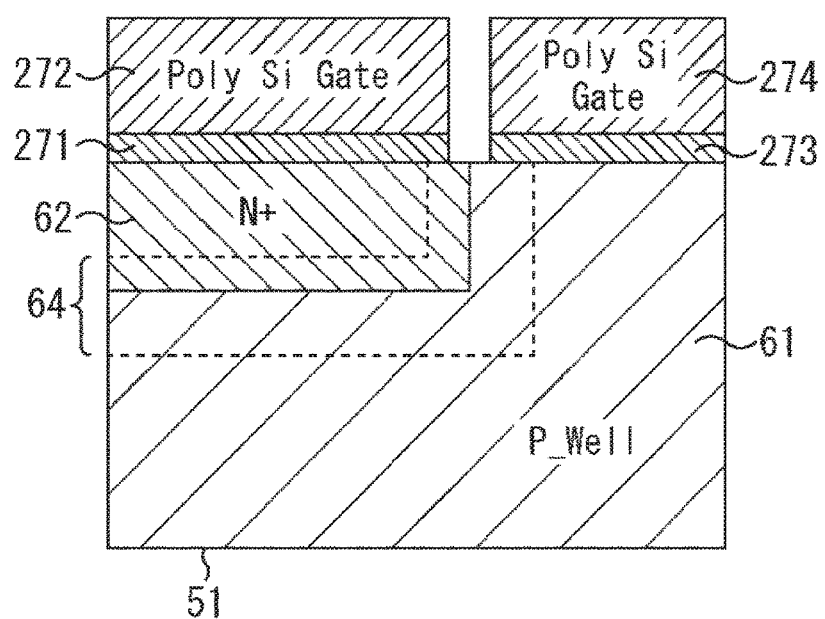
FIG. 22 is a diagram illustrating a tenth embodiment of the structure of a PN junction to which the present technology is applied.

FIG. 22 is a diagram illustrating a tenth embodiment of the structure of the PN junction to which the present technology is applied. As illustrated in the example of FIG. 22, as in the example of FIG. 4, an N+ region is formed in a P-type Well (P_Well region) a Si substrate 51. A depletion layer 64 is formed in the circumference of a boundary 63 between the region 61 and an N+ region 62.

In the case of the example of FIG. 22, on the surface of the Si substrate 51, the positive fixed charge layer 91 having positive fixed charge in FIG. 10 is substituted with a poly Si electrode (gate) 272 formed with a Si oxide film 271 interposed therebetween to be formed on the N+ region 62 to be spanned to the depletion layer 64. Further, the negative fixed charge layer 92 having negative fixed charge in FIG. 10 is substituted with a poly Si electrode (gate) 274 formed with a Si oxide film 272 interposed therebetween to be formed on the P_Well region 61 to be spanned to the depletion layer 64.

At this time, the poly Si electrodes 272 and 274 may contain either N-type or P-type impurities, but N-type poly Si is preferably formed on the N+ region 62. Then, a positive voltage is applied to the poly Si electrode 272 of the N+ region 62. Further, P-type poly Si is preferably formed on the P_Well region 61. Then, a negative voltage is applied to the poly Si electrode 274 of the P_Well region 61.

By appropriately adjusting this voltage, the potentials of the Si surface as those of the positive fixed charge layer 91 and the negative fixed electrode layer 92 in FIG. 10 can be generated. Thus, it is possible to obtain the same advantage of reducing a leak current as in the case in which the positive fixed charge layer 91 and the negative fixed electrode layer 92 are formed.

<Still Another Example of PN Junction According to the Present Technology>

Figure 23:
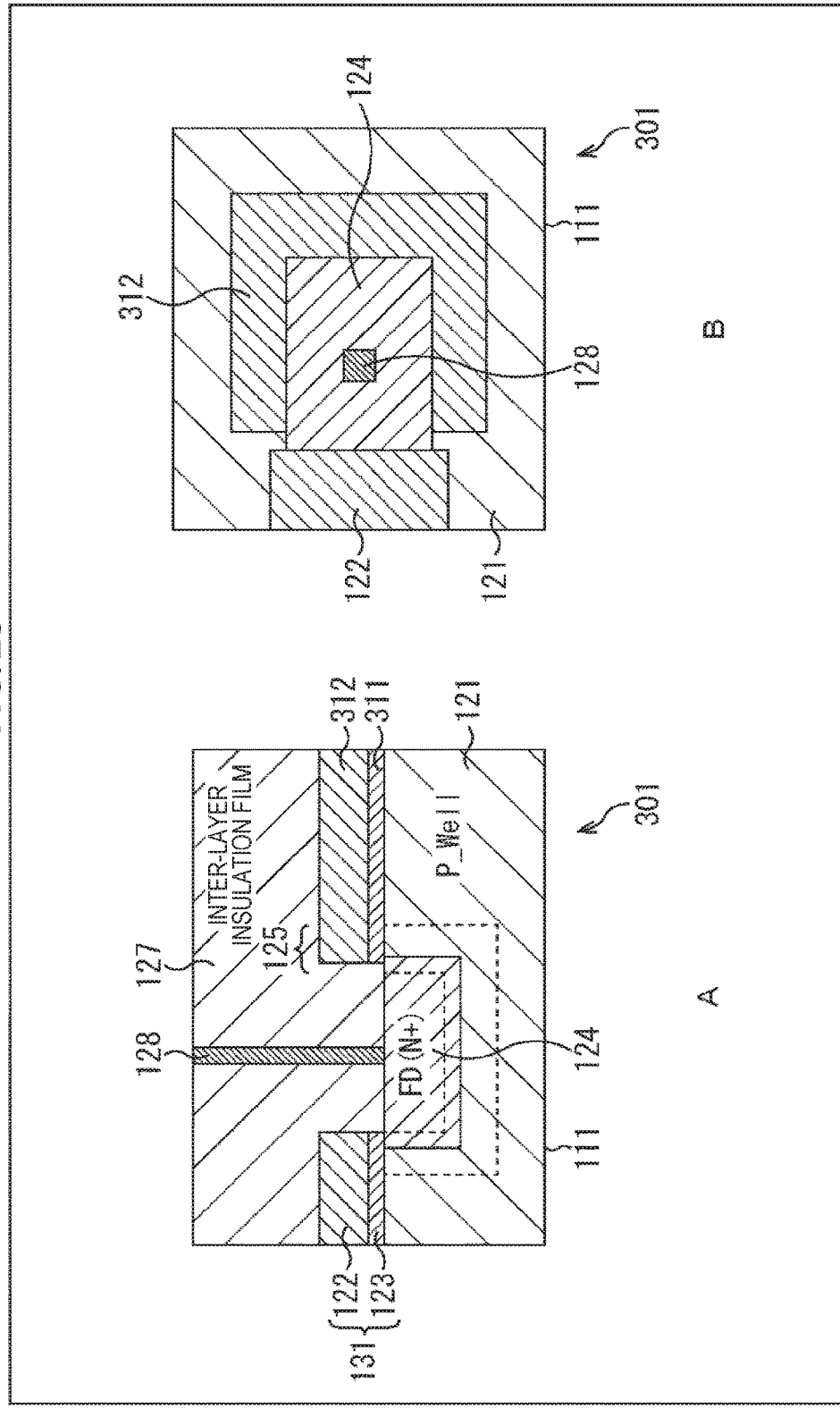
FIG. 23 is a diagram illustrating an eleventh embodiment of the structure of a PN junction to which the present technology is applied.

FIG. 23 is a diagram illustrating an eleventh embodiment of the structure of the PN junction to which the present technology is applied. A of FIG. 23 is a sectional view illustrating a simplified structure of a PN junction to which the present technology is applied. B of FIG. 23 is a plan view illustrating the structure of the PN junction to which the present technology is applied when viewed from the upper side.

The example of FIG. 23 is a combination of the fourth embodiment with FIG. 2 described above. That is, in a pixel 301 in the example of FIG. 23, a photoelectric conversion film is disposed outside a Si substrate 111. The photoelectric conversion film is configured to be connected to an FD 124 on the Si substrate 111 via a conductive wiring. In the example of FIG. 23, the photoelectric conversion film, an upper electrode, and a lower electrode are not illustrated.

In the pixel 301 in FIG. 23, circuits such as an FD 124 and an RST_Tr. 131 formed by a poly electrode 122 and a gate oxide film 123 are formed on the surface of the Si substrate 111 by implanting N-type impurities into a P_Well region 121 formed in the Si substrate 111.

The FD 124 is connected to the photoelectric conversion film interposed between the upper electrode and the lower electrode (not illustrated) via a connection wiring 128. The FD 124 is formed in an N+ region and a depletion layer 125 is formed between the FD 124 and the P_Well region 121.

In such a pixel 301, instead of the negative fixed charge layer 126 in FIG. 15, a poly Si electrode 312 formed with a Si oxide film 311 interposed therebetween is formed to extend from the P_Well region 121 to the depletion layer 125. A leak current occurring in a portion of the FD 124 can be reduced by this structure, that is, by applying a negative bias to the poly Si electrode 312 extending from the P_Well region 121 to the depletion layer 125, because a hole accumulation layer can be formed from the P_Well region 121 to the depletion layer 125 as in the example of FIG. 15.

In the example of B of FIG. 23, the poly Si electrode 312 may not be in contact with the poly electrode 122 so that a space is empty, but may be in contact with the poly electrode 122.

As described above, by applying such a structure, it is possible to reduce a leak current in the PN junction. By applying the structure to a type of CMOS solid-state imaging device in which accumulation is performed in the FD, it is possible to obtain an image in which a dark current component is reduced.

The configuration in which the present technology is applied to the CMOS solid-state imaging device has been described above. The configuration may be applied to a solid-state imaging device such as charge coupled device (CCD) solid-state imaging device. The present technology is applicable not only to a solid-state imaging device but also to a semiconductor device in which an FD or a PD is not necessary.

The solid-state imaging device may be of a backside irradiation type or may be of a frontside irradiation type.

The present technology is not limited to application to the solid-state imaging device, but is also applicable to an imaging apparatus. Here, the imaging apparatus is a camera system such as a digital still camera or a digital video camera or an electronic apparatus having an imaging function of a mobile phone or the like. A form with a module shape mounted on an electronic apparatus, that is, a camera module, is configured as an imaging apparatus.

<Configuration Example of Electronic Apparatus>

FIG. 24 is a block diagram illustrating a configuration example of a camera apparatus which is an electronic apparatus to which the present technology is applied.

A camera apparatus 600 in FIG. 24 includes an optical unit 601 which is, for example, a lens group, a solid-state imaging device (imaging device) 602 in which each structure according to the present technology is adopted, and a DSP circuit 603 which is a camera signal processing circuit. The camera apparatus 600 further includes a frame memory 604, a display unit 605, a recording unit 606, a manipulation unit 607, and a power unit 608. The DSP circuit 603, the frame memory 604, the display unit 605, the recording unit 606, the manipulation unit 607, and the power unit 608 are connected to each other via a bus line 609.

The optical unit 601 acquires incident light (image light) from a subject and forms an image on an imaging surface of the solid-state imaging device 602. The solid-state imaging device 602 converts an amount of incident light formed as the image on the imaging surface by the optical unit 601 into an electric signal in units of pixels and outputs the electric signal as a pixel signal. The solid-state imaging device according to the above-described embodiment can be used as the solid-state imaging device 602.

The display unit 605 is, for example a panel type display device such as a liquid crystal panel or an organic electroluminescence (EL) panel and displays a moving image or a still image captured by the solid-state imaging device 602. The recording unit 606 records the moving image or the still image captured by the solid-state imaging device 602 on a recording medium such as a video tape or a digital versatile disk (DVD).

The manipulation unit 607 issues manipulation instructions in regard to various functions of the camera apparatus 600 under a manipulation by the user. The power unit 608 appropriately supplies various kinds of power serving as operational power of the DSP circuit 603, the frame memory 604, the display unit 605, the recording unit 606, and the manipulation unit 607 to these supply targets.

Note that, in this specification, steps in which the program to be recorded in the recording medium is written do not necessarily have to be performed in time series in line with the order of the steps, and instead may include processing that is performed in parallel or individually.

An embodiment of the disclosure is not limited to the embodiments described above, and various changes and modifications may be made without departing from the scope of the disclosure.

Further, each step described by the above-mentioned flow charts can be executed by one apparatus or by allocating a plurality of apparatuses.

In addition, in the case where a plurality of processes are included in one step, the plurality of processes included in this one step can be executed by one apparatus or by sharing a plurality of apparatuses.

Further, an element described as a single device (or a processing unit) above may be divided and configured as a plurality of devices (or processing units). On the contrary, elements described as a plurality of devices processing units) above may be configured collectively as a single device (or a processing unit). Further, an element other than those described above may be added to each device (or a processing unit). Furthermore, a part of an element of a given device (or a processing unit) may be included in an element of another device (or another processing unit) as long as the configuration or operation of the system as a whole is substantially the same. In other words, an embodiment of the disclosure is not limited to the embodiments described above, and various changes and modifications may be made without departing from the scope of the disclosure.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Additionally, the present technology may also be configured as below (1)

A semiconductor device including:

at least one of a negative fixed charge film that has negative fixed charge, extends from a P-type region to a depletion layer on a surface of a PN junction formed in a semiconductor substrate, and has a boundary located in the depletion layer in the PN junction and a positive fixed charge film that has positive fixed charge, extends from an N-type region to the depletion layer on the surface of the PN junction, and has a boundary located in the depletion layer in the PN junction.

(2)

The semiconductor device according to (1), wherein the positive fixed charge film is a plasma oxide film.

(3)

The semiconductor device according to (1), wherein the positive fixed charge film is a SiO2 film that contains nitrogen atoms.

(4)

The semiconductor device according to any of (1) to (3), wherein the negative fixed charge film is an oxide that contains at least one kind of element of hafnium, zirconium, aluminum, tantalum, titanium, yttrium, and lanthanoid.

(5)

The semiconductor device according to any of (1) to (4), wherein the semiconductor device is a solid-state imaging device, and the semiconductor device further includes:

a floating diffusion region that is separated from a periphery using the PN junction in the semiconductor substrate; and a photoelectric conversion layer that is connected to the floating diffusion region via a conductive wiring.

(6)

The semiconductor device according to (5), wherein the photoelectric conversion layer is a chalcopyrite-based material.

(7)

The semiconductor device according to (5), wherein the photoelectric conversion layer is an organic material.

(8)

An electronic apparatus including:

a solid-state imaging device that includes a floating diffusion region that is separated from a periphery using a PN junction in a semiconductor substrate, a photoelectric conversion layer that is connected to the floating diffusion region via a conductive wiring, and at least one of a negative fixed charge film that has negative fixed charge, extends from a P-type region to a depletion layer on a surface of the PN junction formed in the semiconductor substrate, and has a boundary located in the depletion layer in the PN junction and a positive fixed charge film that has positive fixed charge, extends from an N-type region to the depletion layer on the surface of the PN junction, and has a boundary located in the depletion layer in the PN junction;

a signal processing circuit that processes an output signal output from the solid-state imaging device; and an optical system that causes incident light to be incident on the solid-state imaging device.

(9)

A semiconductor device including:

at least one of a polysilicon gate that extends from a P-type region to a depletion layer on a surface of a PN junction formed in a semiconductor substrate and has a boundary located in the depletion layer in the PN junction and a polysilicon gate that extends from an N-type region to the depletion layer on the surface of the PN junction and has a boundary located in the depletion layer in the PN junction.

(10)

The semiconductor device according to (9),
wherein the semiconductor device is a solid-state imaging device, and
the semiconductor device further includes:
a floating diffusion region that is separated from a periphery using the PN junction in the semiconductor substrate; and
a photoelectric conversion layer that is connected to the floating diffusion region via a conductive wiring.

(11)

An electronic apparatus including:
a solid-state imaging device that includes
a floating diffusion region that is separated from a periphery using a PN junction in a semiconductor substrate,
a photoelectric conversion layer a is connected to the floating diffusion region via a conductive wiring, and
at least one of a polysilicon gate that extends from a P-type region to a depletion layer on a surface of the PN junction formed in the semiconductor substrate and has a boundary located in the depletion layer in the PN junction and a polysilicon gate that extends from an N-type region to the depletion layer on the surface of the PN junction and has a boundary located in the depletion layer in the PN junction;
a signal processing circuit that processes an output signal output from the solid-state imaging device; and
an optical system that causes incident light to be incident on the solid-state imaging device.

REFERENCE SIGNS LIST 1 solid-state imaging device
2 pixel
21 semiconductor substrate
22 photoelectric conversion film
23 upper electrode
24 lower electrode
25 wiring layer
31 floating diffusion
32 RST_Tr.
33 AMP_Tr.
51 Si substrate
61 P_Well region
62 N+ region
63 boundary
64 depletion layer
65 fixed charge layer
81 fixed charge layer
91 fixed charge layer
92 fixed charge layer
101 pixel
111 semiconductor substrate
121 P_Well region
122 Poly electrode
123 gate oxide film
124 FD
125 depletion layer
126 negative fixed charge layer
127 inter-layer insulation film
128 connection wiring
151 pixel
162 positive fixed charge layer
181 pixel
191 negative fixed charge layer
192 positive fixed charge layer
201 pixel
211 negative fixed charge layer
212 positive fixed charge layer
251 Si oxide film
252 poly Si electrode
261 Si oxide film
262 poly Si electrode
271 Si oxide film
272 poly Si electrode
273 Si oxide film
273 poly Si electrode
301 pixel
311 Si oxide film
312 poly Si electrode
600 camera apparatus
501 solid-state imaging device
601 optical unit
603 DSP circuit

What is claimed is:

1. A semiconductor device comprising:
at least one negative fixed charge film that has a negative fixed charge, wherein the at least one negative fixed charge film extends from a P-type region to a depletion layer on a surface of a PN junction formed in a semiconductor substrate, wherein the negative fixed charge film has a boundary located in the depletion layer in the PN junction; and
a positive fixed charge film that has a positive fixed charge, wherein the positive fixed charge film extends from an N-type region to the depletion layer on the surface of the PN junction, wherein the positive fixed charge film has a boundary located in the depletion layer in the PN junction.

2. The semiconductor device according to claim 1, wherein the positive fixed charge film is a plasma oxide film.

3. The semiconductor device according to claim 1, wherein the positive fixed charge film is a SiO2 film that contains nitrogen atoms.

4. The semiconductor device according to claim 1, wherein the negative fixed charge film is an oxide that contains at least one kind of element of hafnium, zirconium, aluminum, tantalum, titanium, yttrium, and lanthanoid.

5. The semiconductor device according to claim 1, wherein the semiconductor device is a solid-state imaging device, and
the semiconductor device further comprises:
a floating diffusion region that is separated from a periphery using the PN junction in the semiconductor substrate; and
a photoelectric conversion layer that is connected to the floating diffusion region via a conductive wiring.

6. The semiconductor device according to claim 5, wherein the photoelectric conversion layer is a chalcopyrite-based material.

7. The semiconductor device according to claim 5, wherein the photoelectric conversion layer is an organic material.

8. An electronic apparatus comprising:
a solid-state imaging device that includes
a floating diffusion region that is separated from a periphery using a PN junction in a semiconductor substrate,
a photoelectric conversion layer that is connected to the floating diffusion region via a conductive wiring,
at least one negative fixed charge film that has a negative fixed charge, wherein the at least one negative fixed charge film extends from a P-type region to a depletion layer on a surface of the PN junction formed in the semiconductor substrate, wherein the at least one negative fixed charge film has a boundary located in the depletion layer in the PN junction, and a positive fixed charge film that has positive fixed charge, wherein the positive fixed charge film extends from an N-type region to the depletion layer on the surface of the PN junction, wherein the positive fixed charge film has a boundary located in the depletion layer in the PN junction;

a signal processing circuit that processes an output signal output from the solid-state imaging device; and an optical system that causes incident light to be incident on the solid-state imaging device.

* * * * *